United States Patent
Motoyama et al.

(10) Patent No.: US 9,537,005 B2
(45) Date of Patent: Jan. 3, 2017

(54) SEMICONDUCTOR DEVICE, METHOD OF MANUFACTURING SEMICONDUCTOR DEVICE, AND ANTENNA SWITCH MODULE

(71) Applicant: Sony Corporation, Tokyo (JP)

(72) Inventors: Yoshikazu Motoyama, Kagoshima (JP); Hiroki Tsunemi, Kagoshima (JP); Hideo Yamagata, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/174,312

(22) Filed: Jun. 6, 2016

(65) Prior Publication Data

US 2016/0293759 A1    Oct. 6, 2016

Related U.S. Application Data

(63) Continuation of application No. 14/605,374, filed on Jan. 26, 2015, now Pat. No. 9,379,239, which is a
(Continued)

(30) Foreign Application Priority Data

Nov. 7, 2012 (JP) .................................. 2012-245161

(51) Int. Cl.
*H01L 29/78* (2006.01)
*H01L 23/48* (2006.01)
(Continued)

(52) U.S. Cl.
CPC ......... *H01L 29/7841* (2013.01); *H01L 21/265* (2013.01); *H01L 23/481* (2013.01); *H01L 23/66* (2013.01)

(58) Field of Classification Search
CPC ........................... H01L 29/7841; H01L 23/481
See application file for complete search history.

(56) References Cited

U.S. PATENT DOCUMENTS

| | | | | |
|---|---|---|---|---|
| 8,310,028 B2* | 11/2012 | Kiriyama | ................ | H01L 22/14 257/602 |
| 2006/0252229 A1 | 11/2006 | Joly et al. | | |
| 2013/0026663 A1* | 1/2013 | Radu | ................ | H01L 21/76254 257/798 |

FOREIGN PATENT DOCUMENTS

| | | |
|---|---|---|
| CN | 1245971 A | 3/2000 |
| JP | H01-199469 A | 8/1989 |

(Continued)

OTHER PUBLICATIONS

A. Botula, et al., "A Thin-film SOI 180nm CMOS RF Switch Technology", 2009 IEEE, IBM Microelectronics, Essex Junction, VT, 05452, USA, pp. 1-4.

(Continued)

*Primary Examiner* — Marc Armand
(74) *Attorney, Agent, or Firm* — Michael Best & Friedrich LLP

(57) ABSTRACT

Disclosed is a semiconductor device having a radio frequency switch. Also disclosed are an antenna switch module and a method of manufacturing the semiconductor device. The semiconductor device includes a metal wiring insulating film bonded to a silicon substrate. In the semiconductor device, a crystal defect layer extends into the silicon substrate from a surface of the silicon substrate. Crystal defects are throughout the crystal defect layer. The semiconductor device and an integrated circuit are in the antenna switch module. The integrated circuit in the antenna switch module is mounted with the radio-frequency switch device and the silicon substrate. The method of manufacturing the semiconductor device includes a step of forming crystal defects throughout a silicon substrate. Radiation or a diffusion is used to form the crystal defects. After the step of forming the crystal defects, the method includes a step of implanting ions
(Continued)

into a surface of the silicon substrate to form a crystal defect layer.

23 Claims, 14 Drawing Sheets

Related U.S. Application Data continuation of application No. 14/044,983, filed on Oct. 3, 2013, now Pat. No. 8,987,866.

(51) Int. Cl.
*H01L 23/66* (2006.01)
*H01L 21/265* (2006.01)

(56) References Cited

FOREIGN PATENT DOCUMENTS

| JP | H03-83343 A | 4/1991 |
|---|---|---|
| JP | 05-343667 | 12/1993 |
| JP | 06-029376 | 2/1994 |
| JP | H08-78646 A | 3/1996 |
| JP | H09-219528 A | 8/1997 |
| JP | 2000/100676 A | 4/2000 |
| JP | 2010/003899 A | 1/2010 |
| JP | 2010/114155 A | 5/2010 |
| JP | 2010/114409 A | 5/2010 |
| JP | 2010/178026 A | 8/2010 |
| JP | 2012/533887 A | 12/2012 |
| WO | WO-2011/008893 A1 | 1/2011 |
| WO | WO-2011/082079 A1 | 7/2011 |
| WO | WO-2012/066021 A1 | 5/2012 |

OTHER PUBLICATIONS

Japanese Office Action issued Feb. 23, 2016 for corresponding Japanese Application No. 2012-245161.
Chinese Office Action issued Aug. 3, 2016 for corresponding Chinese Application No. 201310533560.9.

\* cited by examiner

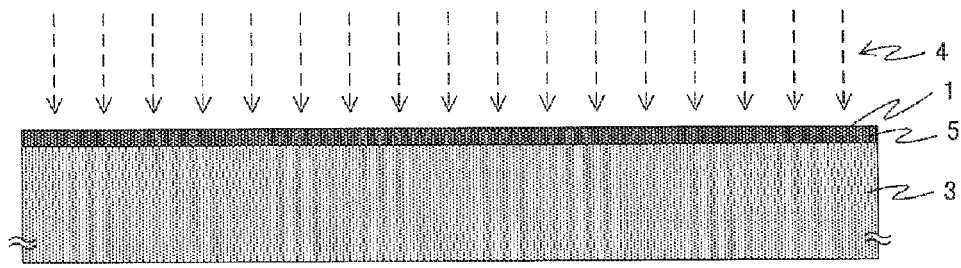
FIG. 4
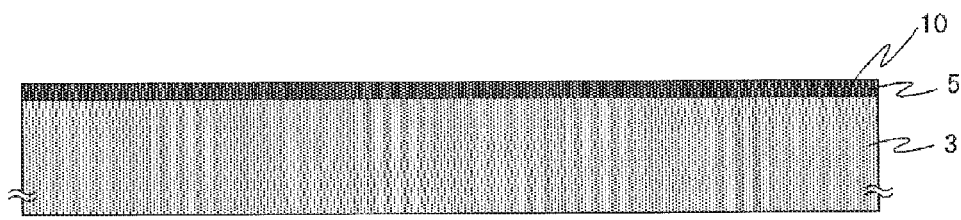
FIG. 5
| TYPE OF SUPPORT SUBSTRATE | THERMAL CONDUCTI-VITY | DIELECTRIC TANGENT |
|---|---|---|
| Si | 149 | 0.0002 |
| Epi-Poly | 90 | 0.001 |
| Poly (FOR SOLAR CELL) | 34 | 0.0002 |
| GaAs | 46 | 0.016 |
| SiN | 25 | 0.002 |
| SiN(RADIATION TYPE) | 150 | 0.003 |
| SiC(6H) | 490 | 0.003 |
| SiO2 | 10.7 | 1.30E-05 |
| AlN | 150 | 0.001 |
| ALUMINA | 38 | 0.0003 |
| SAPPHIRE | 42 | 0.0001 |
FIG. 6

| EFFECT OF ELECTRON BEAM IRRADIATION | [INITIAL VALUE BEFORE IRRADIATION] −[VALUE AFTER IRRADIATION] |
|---|---|
| FOR SECOND HARMONICS | −20 dB |
| FOR THIRD HARMONICS | −25 dB |

SEMICONDUCTOR DEVICE, METHOD OF MANUFACTURING SEMICONDUCTOR DEVICE, AND ANTENNA SWITCH MODULE

CROSS REFERENCES TO RELATED APPLICATIONS

This is a Continuation application of application Ser. No. 14/605,374, filed on Jan. 26, 2015, which is a Continuation application of application Ser. No. 14/044,983, filed on Oct. 3, 2013, now U.S. Pat. No. 8,987,866, issued on Mar. 24, 2015, which claims priority to Japanese Patent Application JP 2012-245161, filed with the Japan Patent Office on Nov. 7, 2012, the entire contents of which being incorporated herein by reference.

BACKGROUND

The present disclosure relates to a semiconductor device, a method of manufacturing such a semiconductor device, and an antenna switch module, and more specifically to a semiconductor device having a radio-frequency switch device on an SOI (Silicon on Insulator) substrate, a method of manufacturing such a semiconductor device, and an antenna switch module.

In recent years, for antenna switch devices, FETs (Field-Effect Transistors) of compound semiconductors (for example, GaAs) that allow complicated switch circuits with reduced power consumption to be manufactured easily have been utilized.

However, such compound semiconductor FETs have been disadvantageous in that they may be expensive in themselves, and they may involve high manufacturing costs for a reason that it is necessary to incorporate peripheral circuits that are fabricated on a separate chip as a module, or for any other reason. It is to be noted that examples of the peripheral circuits may include a DC-DC converter, an IPD (Integrated Passive Device), and the like.

Consequently, in recent years, the development of antenna switch devices using an SOI substrate that enables mixed mounting with a DC-DC converter circuit that is a silicon-based device to be used as a peripheral circuit has been actively carried forward. The SOI substrate has an advantage of being capable of reducing any parasitic capacitance (depletion layer capacitance) that may be caused due to PN-junction, which ensures to achieve the high-performance antenna switch devices equivalent to compound-based semiconductors.

However, the SOI substrate has a disadvantage of deterioration in the electrical characteristics that may be caused due to self-heating of MOS transistors. This self-heating is typically a Joule heat resulting from channel resistances, being generated by a current flowing through a channel region when an FET is put in ON state.

In particular, MOS transistors that are fabricated on the SOI substrate are separated from silicon of a support substrate by means of a material (for example, silicon oxide) with the thermal conductivity lower than that of silicon by two orders of magnitude or more, and thus any heat arising at a channel region may be hard to be dissipated due to an effect of silicon oxide directly underneath channels, causing the heat dissipation characteristics to be further deteriorated. It is to be noted that the thermal conductivity of silicon is about 144 [W/(m·K)], while the thermal conductivity of silicon oxide is about 1.1 [W/(m·K)].

Examples of technologies for solutions to disadvantages as described above may include some technologies that are disclosed in Japanese Unexamined Patent Application Publication No. H06-029376, Japanese Unexamined Patent Application Publication No. H05-343667, and the nonpatent document 1: A. Botula, et al., "A Thin-film SOI 180 nm CMOS RF Switch Technology", Silicon Monolithic Integrated Circuits in RF Systems, 2009.

An integrated circuit device that is described in Japanese Unexamined Patent Application Publication No. H06-029376 includes an n-type semiconductor layer to be bonded via a silicon oxide film on a semiconductor support substrate, wherein a backside contact trench that is formed in a manner of running through the silicon oxide film from the backside of the semiconductor support substrate to reach the semiconductor layer is formed at a semiconductor support substrate region on the underside of this semiconductor layer, and a metallic conductive member is embedded into this backside contact trench. Through this metallic conductive member, any heat arising on the semiconductor layer is dissipated.

However, in the technology disclosed in Japanese Unexamined Patent Application Publication No. H06-029376, a large number of backside contact trenches may be necessary when a spacing area for switch devices that are formed on the semiconductor layer is large. Accordingly, such a technology is disadvantageous in that rewiring from the semiconductor support substrate side may be difficult for a portion of the backside contact trenches, which may make it difficult to reduce a size.

In the technology disclosed in the nonpatent document 1, radio-frequency switch elements (source region, drain region, gate oxide film, source electrode, gate electrode, and drain electrode) are formed on an SOI substrate where an insulating film and a semiconductor layer are formed in order of precedence on a semiconductor substrate, wherein trenches running through an area as far as the semiconductor substrate are formed at the periphery of the radio-frequency switch elements, and a crystal defect layer as a damage layer is formed on the semiconductor substrate in a manner of, for example, implanting argon onto a semiconductor substrate area at the bottom of the trenches using an ion implanting technique.

This crystal defect layer traps, that is, recombines any carriers arising within the semiconductor substrate when radio-frequency signals are applied, which prevents variation in the capacitance of the substrate to improve the harmonic distortion characteristics. Additionally, by forming an electrode running through the semiconductor substrate from the semiconductor layer, a potential of the substrate is fixed to further enhance the effectiveness of preventing variation in the capacitance of the substrate.

However, in the technology disclosed in the nonpatent document 1, a region (crystal defect layer as a damage layer) for trapping any carriers arising within the semiconductor substrate when radio-frequency signals are applied is not present directly beneath transistors, which makes it difficult to completely suppress variations of carriers.

Further, for a support substrate for the SOI substrate to be used for the radio-frequency switches, a substrate with quite high resistance values may be typically used, and thus there is a disadvantage that the intended effectiveness of an electrode running through the semiconductor layer and the semiconductor substrate for the purpose of fixing a substrate potential is reduced. In addition, there is also a disadvantage that manufacturing costs rise due to increased number of processes.

A method concerning improvements of deterioration in the electrical characteristics due to self-heating that is disclosed in Japanese Unexamined Patent Application Publication No. H06-029376 as described above, which adopts the backside contact for heat dissipation, dissipates any heat by means of the metallic conductive member. Further, a method concerning improvements of the harmonic distortion characteristics that is disclosed in the nonpatent document 1, which adopts the crystal defect layer on one side of the semiconductor substrate, prevents variation in the substrate capacitance by trapping, that is, recombining any carriers that are generated by a radio-frequency field by means of the crystal defect layer to suppress generation of the harmonic distortion.

However, in recent years, as technologies for achieving higher-powered outputs have been advanced, and the field intensity has been increasingly raised, it may be insufficient in some cases to provide the crystal defect layer on only one side of the semiconductor substrate. In such a case, an electron beam irradiation method that allows crystal defects to be introduced uniformly over a whole surface of the substrate may be helpful, although this has posed a disadvantage that the device characteristics vary due to the influence of a hole trap which is formed in a silicon oxide film.

Examples of disadvantages that have been found in the past may include drop in threshold voltages of n-channel MOSFETs, rise in threshold voltages of p-channel MOSFETs, and rise in polysilicon resistances that is caused due to introduction of crystal defects.

A technology for a solution to the disadvantage as described above is disclosed in Japanese Unexamined Patent Application Publication No. H05-343667.

A method of repeating electron beam irradiation and thermal treatment more than once that are applied to power device IGBTs (Insulated Gate Bipolar Transistors) is disclosed in Japanese Unexamined Patent Application Publication No. H05-343667. In this method, by changing the acceleration voltage and irradiation amount for the electron beam irradiation as well as temperature, time, and the like for the thermal treatment, it is possible to tailor a crystal defect layer and device characteristics to fit desired characteristics.

SUMMARY

However, the method described in Japanese Unexamined Patent Application Publication No. H05-343667 has posed a disadvantage that it may be difficult to completely restore devices to status prior to irradiation of electron beams because electron beams are applied directly to the devices, and if the devices are forced to be restored to original status through a thermal treatment, introduced crystal defects may be recovered due to heating.

It is desirable to provide a semiconductor device, a method of manufacturing such a semiconductor device, and an antenna switch module, capable of preventing any thermal destruction due to self-heating of FET elements in antenna switches to be formed on an SOI substrate for controlling high power outputs for radio frequencies, while maintaining excellent harmonic distortion characteristics.

Disclosed is a semiconductor device having a radio frequency switch. Also disclosed are an antenna switch module and a method of manufacturing the semiconductor device. The semiconductor device includes a metal wiring insulating film bonded to a silicon substrate. In the semiconductor device, a crystal defect layer extends into the silicon substrate from a surface of the silicon substrate. Crystal defects are throughout the crystal defect layer. The semiconductor device and an integrated circuit are in the antenna switch module. The integrated circuit in the antenna switch module is mounted with the radio-frequency switch device and the silicon substrate. The method of manufacturing the semiconductor device includes a step of forming crystal defects throughout a silicon substrate. Radiation or a diffusion is used to form the crystal defects. After the step of forming the crystal defects, the method includes a step of implanting ions into a surface of the silicon substrate to form a crystal defect layer.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

FIG. 4 is a cross-sectional view for explaining each step of the manufacturing method illustrated in FIG. 1.

FIG. 5 is a cross-sectional view for explaining each step of the manufacturing method illustrated in FIG. 1.

FIG. 6 is a table comparing characteristics of various types of support substrates.

DETAILED DESCRIPTION

Figure 1:
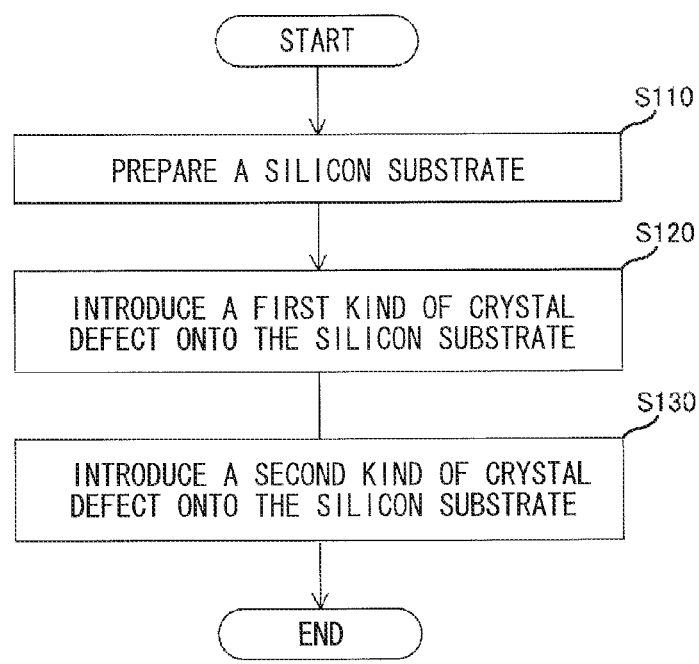
FIG. 1 is a flowchart showing a flow of a method of manufacturing a semiconductor device according to a first embodiment of the present disclosure.

Hereinafter, some example embodiments of the present disclosure are described in the order given below.
(A) First Embodiment
(B) Second Embodiment
(C) Third Embodiment
(D) Fourth Embodiment
(E) Fifth Embodiment
(F) Summary of Example Embodiments
(A) First Embodiment FIG. 1 is a flowchart showing a flow of a method of manufacturing a semiconductor device according to a first embodiment of the present disclosure, and FIG. 2 to FIG. 5 are each a cross-sectional view of a semiconductor device corresponding to each step of the manufacturing method illustrated in FIG. 1. Hereinafter, the description is provided along a flow of the manufacturing method illustrated in FIG. 1.

Figure 2:
FIG. 2 is a cross-sectional view for explaining each step of the manufacturing method illustrated in FIG. 1.

In the manufacturing method illustrated in FIG. 1, to start with, a silicon substrate 1 as shown in FIG. 2 is prepared that is served as a base for a crystal defect introduction substrate (S110). FIG. 2 is a cross-sectional view of the silicon substrate 1.

For the silicon substrate 1, a silicon substrate with the oxygen concentration within a range of about $1\times10^{15}$ to about $1\times10^{17}$ atoms/cubic centimeter and the specific resistance within a range of about 100 to about $1\times10^5$ Ωcm that is fabricated in an FZ (Floating Zone) method, or a silicon substrate with the specific resistance within a range of about 100 to about $1\times10^5$ Ωcm that epitaxially grows silicon on a substrate fabricated in a CZ (Czochralski) method or an MCZ (Magnetic-Field-applied Czochralski) method may be used. With a substrate having a caliber of about eight inches, the substrate of about 725 μm in thickness may be considered to be appropriate.

Next, a crystal defect 3 is introduced as a first kind of crystal defect (first crystal defect) on the silicon substrate 1 using an electron beam irradiation method (S120).

It is to be noted that a method of introducing the crystal defect 3 as the first kind of crystal defect is not limited to the electron beam irradiation, but a method of applying radiation, such as gamma ray and neutron ray, to an ingot or a silicon substrate that is fabricated in the FZ method, as well as a method of diffusing iron, gold, platinum, and the like that are heavy-metal materials as far as a backside of a wafer at high temperature for a long period of time to a silicon substrate fabricated in the FZ method may be adopted alternatively. It is to be noted that, when the neutron ray is to be used in the former method, it is desirable to form a part of silicon as p-type in advance to compensate for the specific resistance because this turns into phosphorus resulting in n-type.

Figure 3:
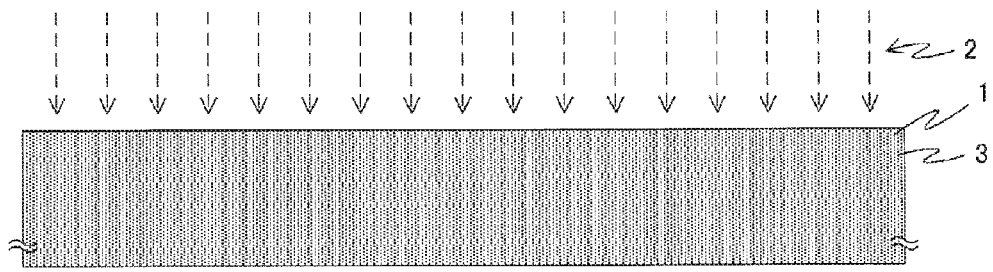
FIG. 3 is a cross-sectional view for explaining each step of the manufacturing method illustrated in FIG. 1.

FIG. 3 is a cross-sectional view in a case where the crystal defect 3 is formed on the silicon substrate 1 by applying an electron beam 2 onto the silicon substrate 1. The crystal defect 3 is a crystal defect that is introduced uniformly over a whole surface of the silicon substrate 1.

In irradiation of the electron beam, a condition that the crystal defect density is within a range of about $1\times10^{14}$ to about $1\times10^{16}$ pieces/cubic centimeter may be preferable, and for example, the amount of irradiation of the electron beam may be within a range of about $1\times10^{14}$ to about $1\times10^{17}$ electrons/square centimeter. For the acceleration voltage, a range of about 1 to about 10 MeV may be appropriate. The electron beam to be applied under such a condition runs through the silicon substrate 1 easily, thereby forming the crystal defect 3 uniformly on the silicon substrate 1.

It is to be noted that, when it is desired to avoid adherence of foreign materials and the like in manufacturing of the silicon substrate 1, a single-layer film or a multilayer film with a thickness within a range of about 1.5 nm to about several 10 μm may be formed, prior to irradiation of the electron beam 2, on the front surface of the silicon substrate 1 as a film for liftoff of foreign materials (for example, silicon oxide film, silicon nitride film, and the like).

Subsequently, using an ion implantation method or any other techniques, a shallow crystal defect 5 is introduced as a second kind of crystal defect (second crystal defect) on the silicon substrate 1 (S130).

FIG. 4 is a cross-sectional view in a case where the shallow crystal defect 5 is formed over a predetermined depth range from the front surface of the silicon substrate 1 by further performing the ion implantation for the silicon substrate 1 onto which the electron beam 2 has been applied.

For example, the ion implantation may be performed through irradiation of an inert gas such as nitrogen and argon, carbon, or silicon using an ion beam 4 under a condition of the acceleration voltage within a range of about 10 KeV to about 2 MeV and the dose amount within a range of about $1\times10^{14}$ to about $1\times10^{16}$ ions/square centimeter. Such a manner forms the shallow crystal defect 5 with high density in a depth range of about 100 nm to several micrometers from the front surface of the silicon substrate 1.

Above-described steps fabricate a support substrate 10 illustrated in FIG. 5. The support substrate 10 fabricated in such a manner has the crystal defect 3 that is formed uniformly over a whole surface of the substrate by the electron beam 2.

With effectiveness of this crystal defect 3, it is possible to eliminate variations in the substrate capacitance that may be caused due to the radio-frequency field without sacrificing any device characteristics at all. Therefore, this makes it possible to resolve an issue of the harmonic distortion that is found in the radio-frequency switch devices.

Further, the support substrate 10 has the shallow crystal defect 5 that is formed over a predetermined depth range from the front surface of the substrate by the ion beam 4 in addition to the crystal defect 3, that is, a double layer of crystal defect. In other words, a defect density of a surface in contact with the radio-frequency switch device is increased. With effectiveness of this double layer of crystal defect, it is possible to suppress the harmonic distortion for a wide dynamic range from a small power output to a large power output.

It is to be noted that, when a liftoff film for removing foreign materials is formed, the liftoff film may be eliminated using an etching technique and the like after completion of the steps S110 to S130.

Further, after completion of the steps S110 to S130, a shortage of a thermal treatment in an assembly step may be made up by carrying out a thermal treatment over a temperature range of about 250 to about 350 degrees centigrade to adjust a capability of suppressing the harmonic distortion.

Further, in this embodiment of the present disclosure, the ion implantation is performed following irradiation of the electron beam, although the order of these steps may be interchanged in such a manner that the step S120 is preceded by the step S130. In this case, the shallow crystal defect 5 that is formed using the ion beam 4 is recrystallized in a polysilicon state through a thermal treatment over a temperature range of about 500 to about 1050 degrees centigrade, and thereafter the uniform crystal defect 3 is formed over a whole surface of the silicon substrate 1 including a depth direction using the ion beam 2.

Figure 7:
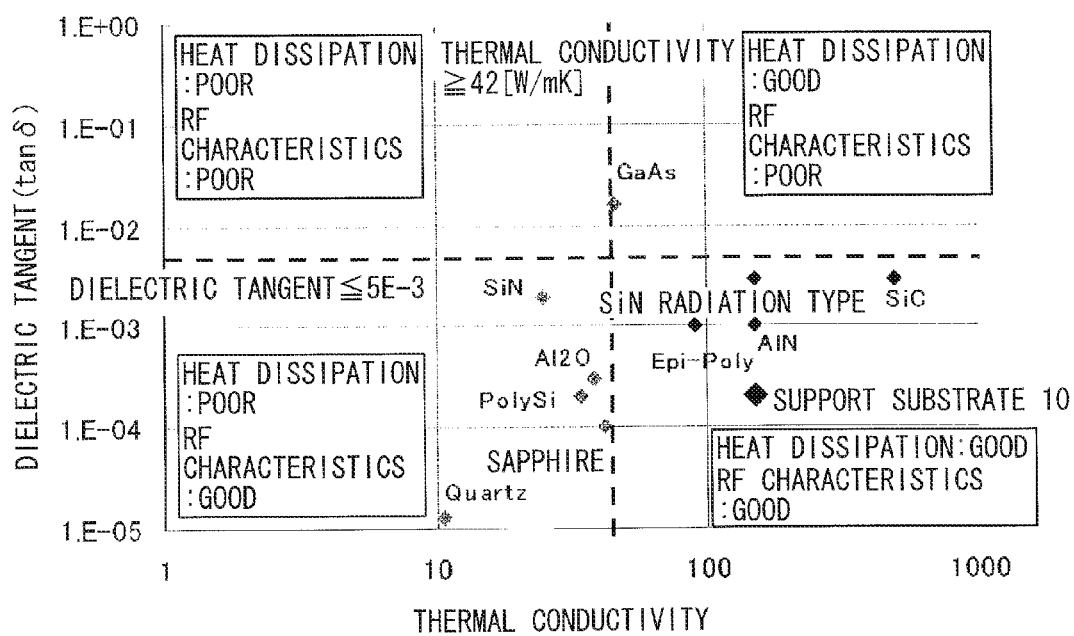
FIG. 7 is a graphic representation of comparison results shown in FIG. 6.

FIG. 6 is a table comparing characteristics of existing SOI substrates, and FIG. 7 is a graphic representation of this comparison result as well as characteristics of the support substrate 10. As shown in FIG. 7, the support substrate 10 according to this first embodiment of the present disclosure is not inferior in characteristics to a sapphire substrate that has typically exhibited excellent thermal conductivity and dielectric tangent characteristics, and a possibility that the support substrate 10 according to this first embodiment of the present disclosure will be a material exceeding the sapphire substrate is suggested provided that a capability of suppressing the harmonic distortion is improved.

(B) Second Embodiment

Next, the description is provided on a second embodiment of the present disclosure. The second embodiment relates to a semiconductor device that is provided with external terminals configured by rewiring on the front surface of a radio-frequency switch device using an SOI substrate in such a manner that an original support substrate for the SOI substrate is removed after bonding a crystal defect introduction substrate on the front surface of the radio-frequency switch device, as well as to a method of manufacturing such a semiconductor device.

Figure 8:
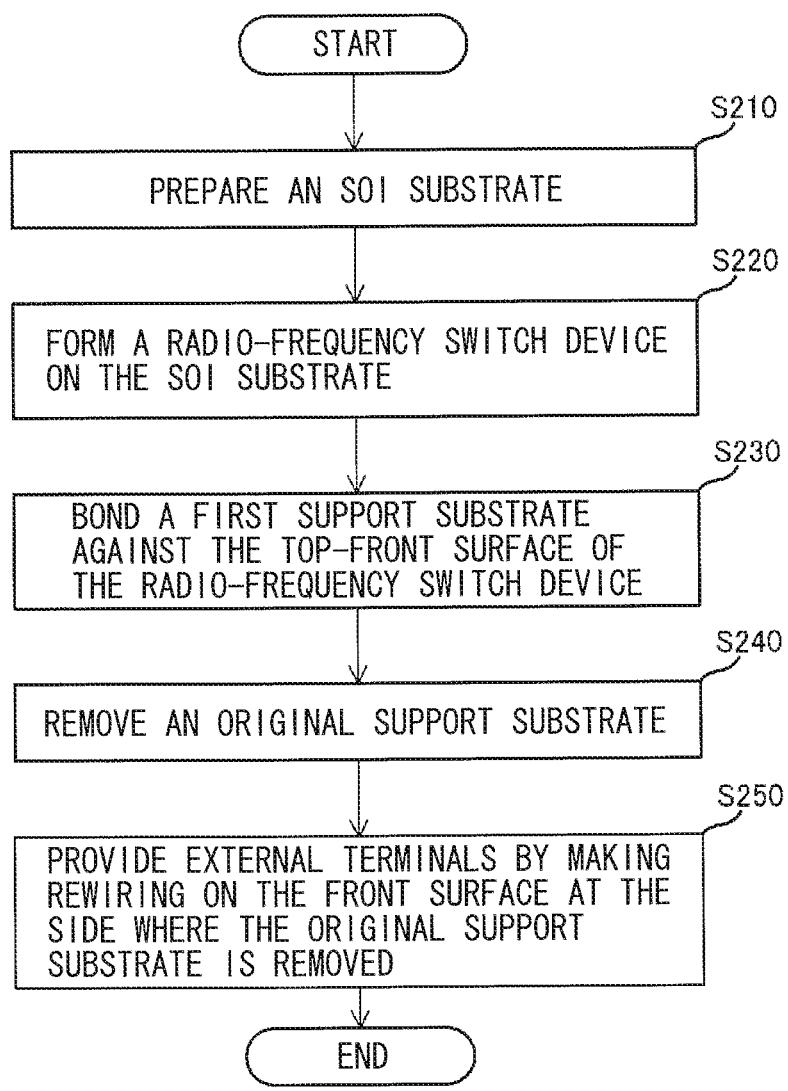
FIG. 8 is a flowchart showing a flow of a method of manufacturing a semiconductor device according to a second embodiment of the present disclosure.

FIG. 8 is a flowchart showing a flow of a method of manufacturing the semiconductor device according to the second embodiment of the present disclosure. FIG. 9 to FIG. 13 are each a cross-sectional view for explaining each step of the manufacturing method illustrated in FIG. 8. Hereinafter, the description is provided along a flow of the manufacturing method illustrated in FIG. 8.

In the manufacturing method illustrated in FIG. 8, to start with, an SOI substrate is prepared (S210).

Figure 9:
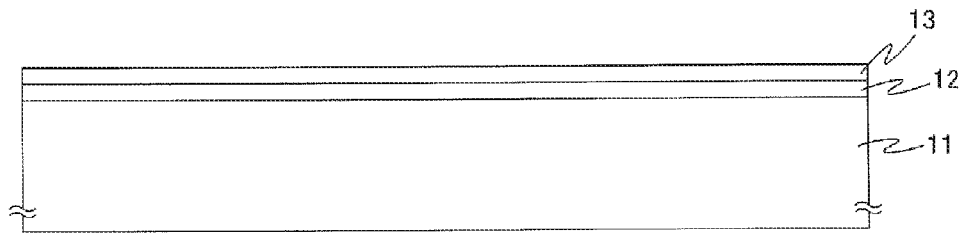
FIG. 9 is a cross-sectional view for explaining each step of the manufacturing method illustrated in FIG. 8.

FIG. 9 shows a cross-sectional view of a typical SOI substrate in use for the radio-frequency switch device. For a support substrate 11 for the SOI substrate, a single-crystal CZ silicon substrate may be typically used in case of a substrate with a caliber of about eight inches. A CZ silicon substrate in use for the support substrate 11 may typically have a planar direction of (100), a film thickness of about 725 μm, a specific resistance within a range of about 500 to about 5000 Ωcm, and an oxygen concentration within a range of about $5\times10^{17}$ to about $5\times10^{18}$ atoms/cubic centimeter.

On the support substrate 11, a silicon oxide film is laminated as a buried oxide (box) layer 12 for the SOI substrate. This silicon oxide film electrically insulates the support substrate 11. The box layer 12 may typically have a film thickness within a range of about 50 to 1000 nm.

Further, on the box layer 12, a top silicon layer 13 for the SOI substrate on which active elements and the like are formed is laminated. For the top silicon layer 13, a single-crystal CZ silicon substrate may be typically used. A CZ silicon substrate in use for the box layer 12 may typically have a planar direction of (100), a film thickness within a range of about 100 to about 5000 nm, a specific resistance within a range of about 1.0 to about 50 Ωcm, and an oxygen concentration within a range of about $5\times10^{17}$ to about $5\times10^{18}$ atoms/cubic centimeter.

Subsequently, a radio-frequency switch device is formed on the SOI substrate (S220).

Figure 10:
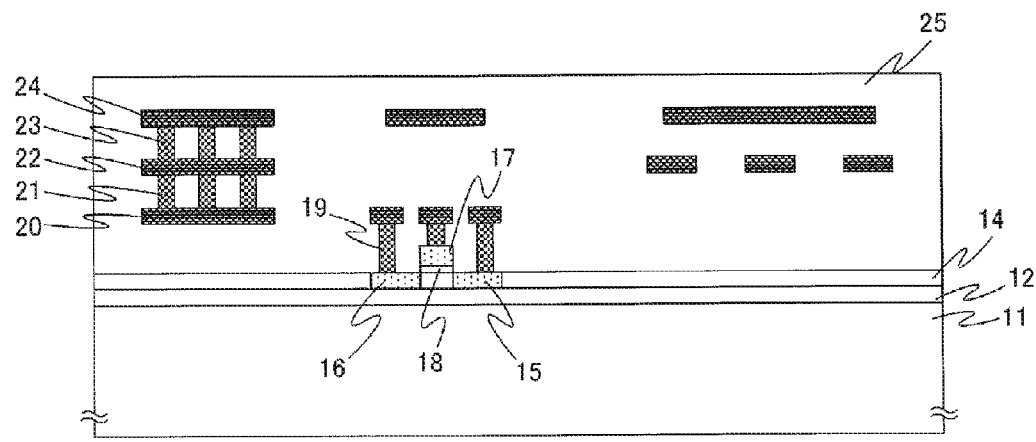
FIG. 10 is a cross-sectional view for explaining each step of the manufacturing method illustrated in FIG. 8.

FIG. 10 shows a cross-sectional view of a radio-frequency switch device according to this embodiment of the present disclosure. The radio-frequency switch device according to this embodiment of the present disclosure is finished up in a manner of using a typical SOI substrate as described above, and performing a wafer process of single-layer polysilicon and three-layer metal wires using, for example, a minimum line width rule of about 0.25 μm.

As shown in FIG. 10, the radio-frequency switch device according to this embodiment of the present disclosure may typically include: MOSFET component parts including an element separation layer 14, a drain region 15, a source region 16, a gate electrode 17, and a gate insulating film 18; multilayer wiring component parts including a metal wiring connection plug 19, a first metal wiring layer 20, a second metal wiring layer 22, a metal wiring connection plug 21 between the first metal wiring layer 20 and the second metal wiring layer 22, a third metal wiring layer 24, and a metal wiring connection plug 23 between the second metal wiring layer 22 and the third metal wiring layer 24; and a protective film including a metal wiring insulating film 25.

A layer including the element separation layer 14, the drain region 15, the source region 16, the gate electrode 17, and the gate insulating film 18 corresponds to a specific but not limitative example of an "element layer" in one embodiment of the present disclosure, and a layer including the metal wiring connection plug 19, the first metal wiring layer 20, the second metal wiring layer 22, the metal wiring connection plug 21 between the first metal wiring layer 20 and the second metal wiring layer 22, the third metal wiring layer 24, the metal wiring connection plug 23 between the second metal wiring layer 22 and the third metal wiring layer 24, and the metal wiring insulating film 25 corresponds to a specific but not limitative example of a "wiring layer" in one embodiment of the present disclosure.

It is to be noted that, as described later, because the support substrate 11 for the SOI substrate may be removed after bonding of a crystal defect introduction substrate, or may be replaced with the crystal defect introduction substrate, use of an inexpensive support substrate 11 may be permitted if it is capable of withstanding a wafer process.

Next, the crystal defect introduction substrate is bonded against the top-front surface of the radio-frequency switch device (S230).

Figure 11:
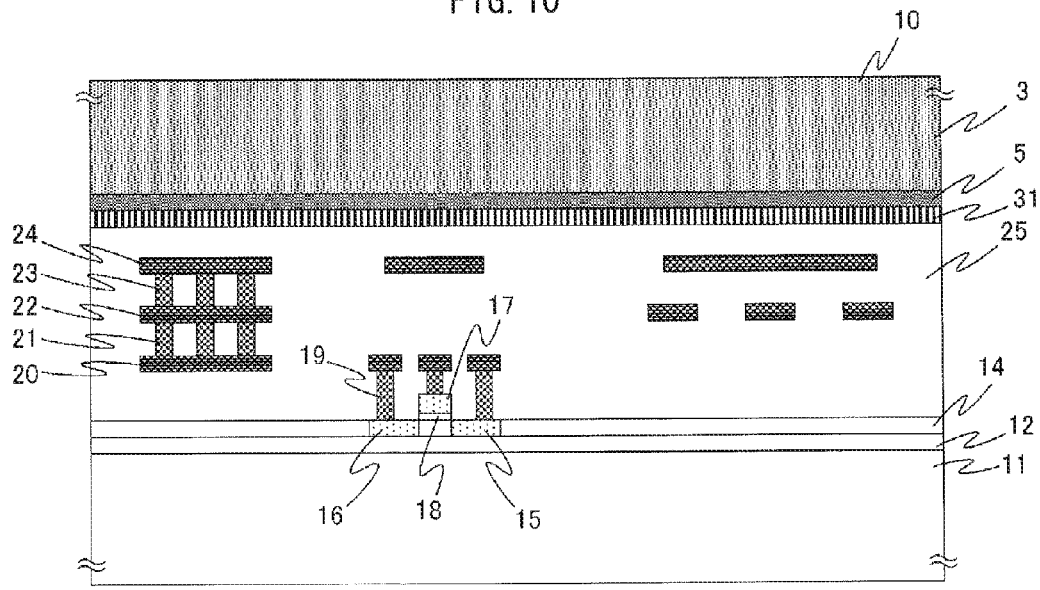
FIG. 11 is a cross-sectional view for explaining each step of the manufacturing method illustrated in FIG. 8.

FIG. 11 is a cross-sectional view in a case where the crystal defect introduction substrate is bonded against the top-front surface of the finished radio-frequency switch device. This figure illustrates a state where the support substrate 10 that is fabricated in the above-described first embodiment of the present disclosure is bonded against the top-front surface of the radio-frequency switch device using an adhesive agent 31.

Preferably, the adhesive agent 31 in use for bonding may have a capability of permanently bonding the support substrate 10 with the radio-frequency switch device, as well as a dielectric tangent (tan δ) of the radio-frequency characteristics within a range of about 0.0001 to about 0.01, and a film thickness within a range of about 50 to about 1000 nm, and a candidate example for such an adhesive agent may include siloxane-based benzocyclobutene (BCB). After bonding of the support substrate 10, an adhesive force may be preferably stabilized by performing a thermal treatment over a temperature range of about 100 to about 350 degrees centigrade.

It is to be noted that, in this second embodiment of the present disclosure, the support substrate 10 is bonded using the adhesive agent 31, although a bonding method is not limited thereto, but a direct bonding without using an adhesive agent may be also permitted after planarizing the front surface by performing a polishing work in a CMP (Chemical Mechanical Polishing) method or a BGR (Back Grind) method.

As described above, by bonding the support substrate 10 against the top-front surface of the radio-frequency switch device, the radio-frequency switch device is located in proximity to the surface on the side opposite to the side coming in contact with the support substrate 10 on a semiconductor layer.

On this occasion, a distance between the MOSFET as the radio-frequency switch device and the support substrate 10 is longer than a distance between the MOSFET and the original support substrate 11 for the SOI substrate, that is, a distance between the support substrate 11 and the MOSFET may be approximately equivalent to a thickness (about 1 μm) of the box layer 12, while a distance between the support substrate 10 and the MOSFET may be in the order of about 10 μm.

In such a manner, separation of the MOSFET from the support substrate 10 allows the harmonic distortion to be reduced, and an experiment demonstrated the improvement effect of about 10 dB in the harmonic distortion. Further, a distance between the MOSFET and the support substrate 10 is, unlike a thickness of the box layer 12, allowed to be controlled optionally to some extent, which facilitates reduction of the harmonic distortion.

The next step removes the support substrate 11 that is the original support substrate for the SOI substrate (S240).

Figure 12:
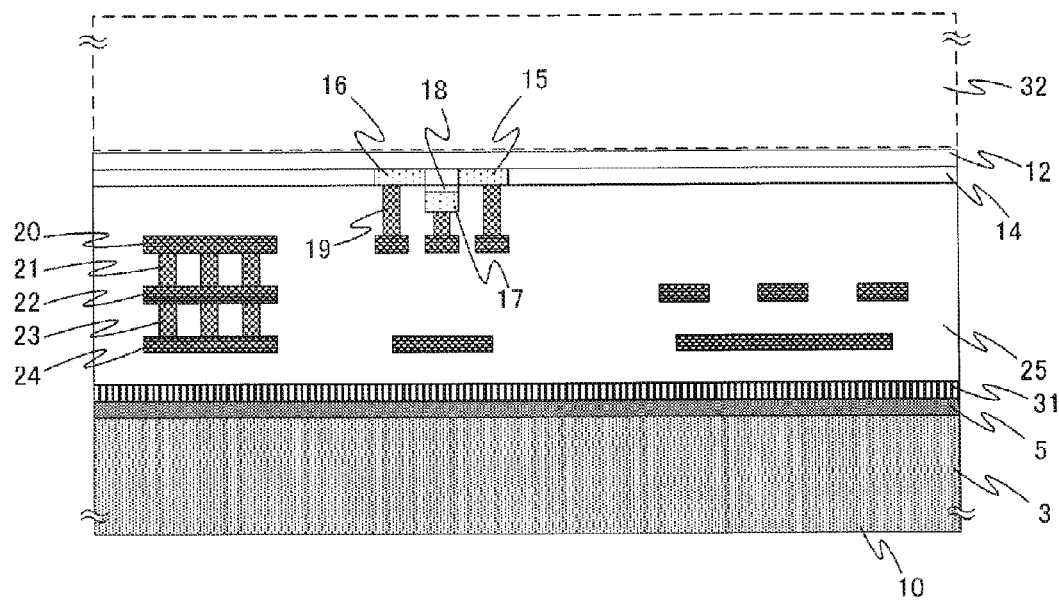
FIG. 12 is a cross-sectional view for explaining each step of the manufacturing method illustrated in FIG. 8.

FIG. 12 is a cross-sectional view in a case where the support substrate 11 for the SOI substrate is removed to expose the box layer 12 on the SOI substrate. A support substrate removal area 32 illustrated in FIG. 12 represents the support substrate 11 that is exfoliated or eliminated.

The support substrate 11 for the SOI substrate may be removed by a polishing work in the CMP method, a grinding work in the BGR method, or a wet etching process using a chemical solution such as a nitric fluoride-based solution. For example, it is possible to remove the support substrate 11 from the SOI substrate without damaging the box layer 12 in such a manner that the support substrate 11 is ground to the degree where a piece of membrane is left in the vicinity of a boundary with the box layer 12 in the CMP or BGR method, and the rest of the support substrate 11 is removed in a wet etching process. It is to be noted that, in this state, a device pattern of the radio-frequency switch device is allowed to be observed optically from a surface on which the support substrate 11 for the SOI substrate has been present, that is, a surface on which the box layer 12 is exposed.

The subsequent step provides external terminals by performing rewiring on the front surface at the side where the original support substrate for the SOI substrate is removed (S250).

Figure 13:
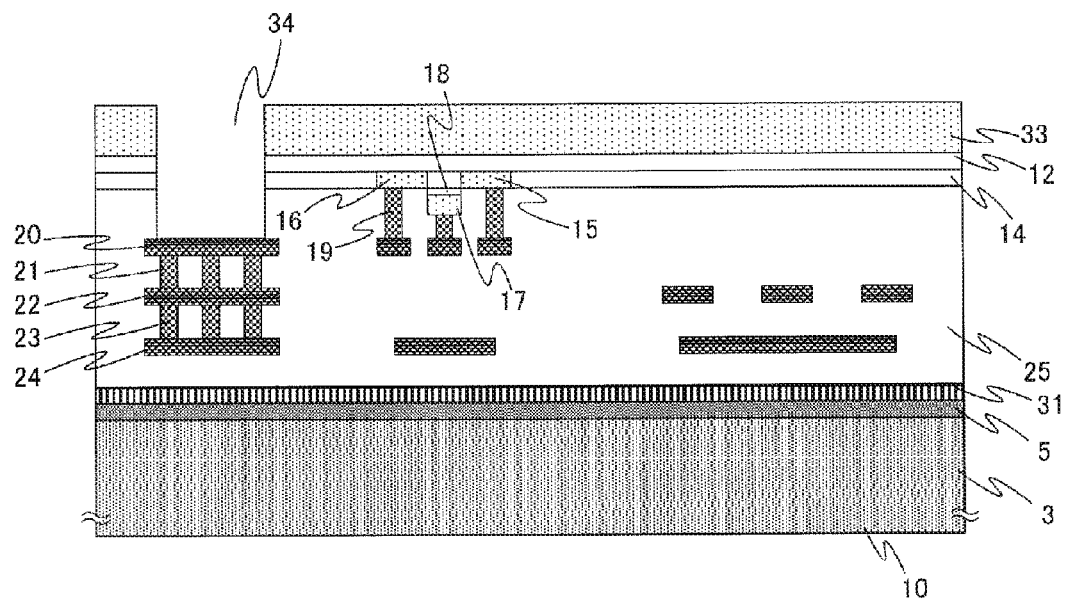
FIG. 13 is a cross-sectional view for explaining each step of the manufacturing method illustrated in FIG. 8.

FIG. 13 is a cross-sectional view in a case where a rewiring insulating film 33 and a metal wiring connection trench 34 are formed on the surface of the box layer 12 of the SOI substrate.

Preferably, the rewiring insulating film 33 may be a silicon nitride film with a film thickness within a range of about 100 to about 5000 nm, and may be formed in a method such as a plasma CVD that is capable of generating the film over a temperature range from room temperature to about 300 degrees centigrade. Following formation of the rewiring insulating film 33, the metal wiring connection trench 34 for rewiring with a diameter within a range of about 5 to 100 μm is etched as far as the first metal wiring layer 20 using lithography and dry etching techniques, thereby exposing the first metal wiring layer 20.

Figures 14, 15:
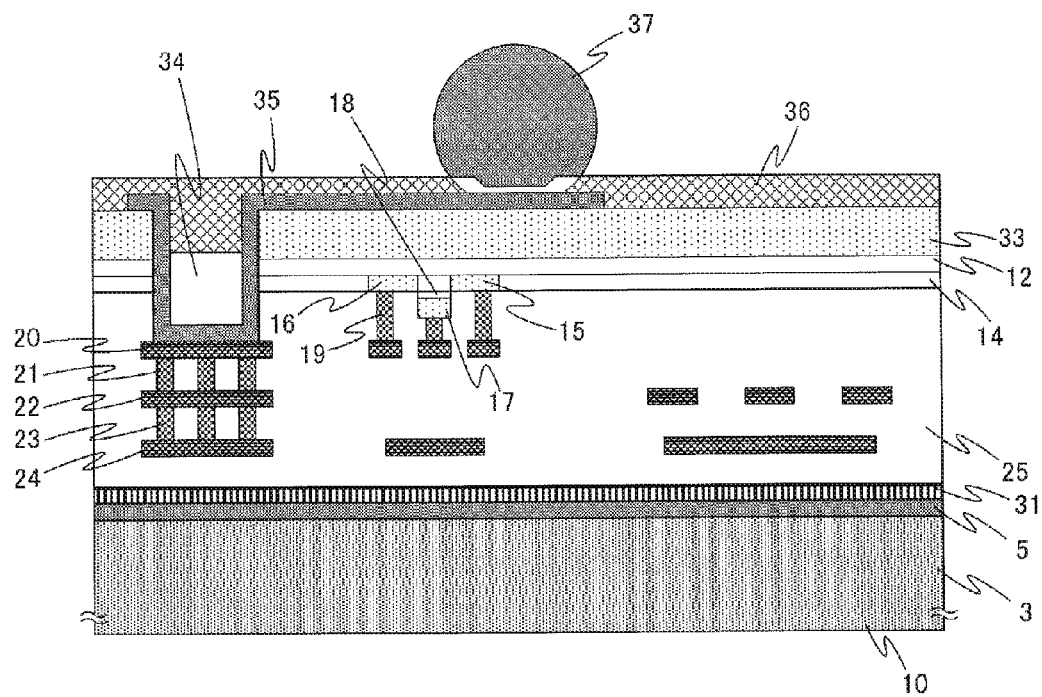
FIG. 14 is a cross-sectional view for explaining each step of the manufacturing method illustrated in FIG. 8.
FIG. 15 is a table for explaining effectiveness of suppressing the harmonic distortion.

FIG. 14 is a cross-sectional view showing a final form of the second embodiment of the present disclosure. To achieve this final form, as a first step, a clean surface of the first metal wiring layer 20 that is located at the bottom of the metal wiring connection trench 34 is exposed using a reverse sputtering of argon or any other techniques, to deposit a titanium film with a thickness within a range of about 10 to about 200 nm in a sputtering method, and a copper film 35 with a thickness within a range of about 50 to about 500 nm is deposited in the sputtering method to form an electrode for copper plating.

Thereafter, rewiring is carried out using a lithography technique. A line width for this rewiring may be within a range of about 5 to 100 μm. Any region to be excluded from the rewiring is electrically insulated with a photosensitive organic film, such as a resist film and a film membrane, and a metallic copper film 35 is precipitated with a thickness within a range of about 1 to 10 μm in an electrolytic method to plate the metallic copper 35 at a portion to be rewired.

Further, when the photosensitive organic film that is formed using the lithography technique and the titanium film that is formed in the sputtering method are removed in turn utilizing a wet or dry etching technique, a rewiring metal wiring layer 35 with a film thickness within a range of about 1 to 10 μm and a line width within a range of about 5 to 100 μm is formed.

Subsequently, photosensitive polyimide is coated as a rewiring protective film 36, and a pilot hole of solder ball 37. The solder ball 37 along with other solder balls form a BGA (Ball Grid Array). The solder ball 37 for a chip electrode is drilled using the lithography technique to perform curing under a nitrogen atmosphere for about 60 minutes over a temperature range of about 250 to about 300 degrees centigrade.

Finally, an organic insulating film that is formed by curing inside the pilot hole of the solder ball 37 for the chip electrode is removed in the dry etching technique such as an oxygen plasma method, and the solder ball 37 for the chip electrode is formed on a clean surface of the metallic copper 35. Such a step brings the rewiring illustrated in FIG. 14 to completion.

It is to be noted that, in the second embodiment of the present disclosure, the rewiring is made at the box layer 12 side of the SOI substrate, although an insulating film may be formed as a protective film on the box layer 12 side of the SOI substrate to make rewiring through a TSV (Through Silicon Via) that is formed at the support substrate 10 side.

In the semiconductor device that is fabricated in the above-described steps, even if carriers, such as holes and electrons, should occur on the support substrate 10 when a radio-frequency signal flows through wiring for transmitting control signals to the MOSFETs, such carriers may disappear before reaching the vicinity of a boundary with the metal wiring insulating film 25 over a lifetime of the crystal defect that is introduced in the support substrate 10.

Accordingly, this prevents aggregation of carriers on the front surface of the substrate, and prevents occurrence of capacitance between the wire and the support substrate 10. Therefore, this has an effect of reducing variations in the substrate capacitance that may be caused due to a harmonic field arising during switching operation.

FIG. 15 is a table for explaining effectiveness of suppressing the harmonic distortion in the semiconductor device according to the second embodiment of the present disclosure. For a signal intensity for each of second harmonics and third harmonics that are generated when radio-frequency signals (for example, several gigahertz signals) are input at a power of about 35 dBm, this table shows a result of comparing a case of using a support substrate with the electron beam irradiation and a case of using a support substrate with no electron beam irradiation.

As shown in this table, it was found that when the support substrate with the electron beam irradiation was used, the intensity was attenuated by about 20 dB for the second harmonics, and was attenuated by about 25 dB for the third harmonics as compared with the support substrate with no electron beam irradiation. It is to be noted that a test cited in this table used a support substrate onto which the electron beam was applied under an irradiation condition of about 4.6 MeV and 504 kGy as the support substrate with the electron beam irradiation.

Further, to bond the support substrate 10 against the surface on the side where the MOSFET is formed, a very thin box layer is only interposed between the MOSFET and a silicon layer on the support substrate 10.

Here, because the MOSFET mainly generates heat among radio-frequency switch devices, and silicon is higher than an oxide film in the thermal conduction coefficient, a structure ensuring to further facilitate heat dissipation as compared with an existing one is achieved. Additionally, it is possible to transfer heat to a printed circuit board on which the switch device element is mounted through conduction via a metal of the solder ball 37 and ambient air, which further improves the heat dissipation effect.

(C) Third Embodiment

Next, the description is provided on a third embodiment of the present disclosure. A semiconductor device according to the third embodiment of the present disclosure is provided with external terminals configured by rewiring on the front surface of a radio-frequency switch device using an SOI substrate in such a manner that an original support substrate for the SOI substrate is replaced with a crystal defect introduction substrate after bonding a temporary support substrate against the front surface of the radio-frequency switch device, and thereafter the temporary support substrate is removed. Hereinafter, the description is provided on an example of a manufacturing method and a structure of such a semiconductor device.

Figure 16:
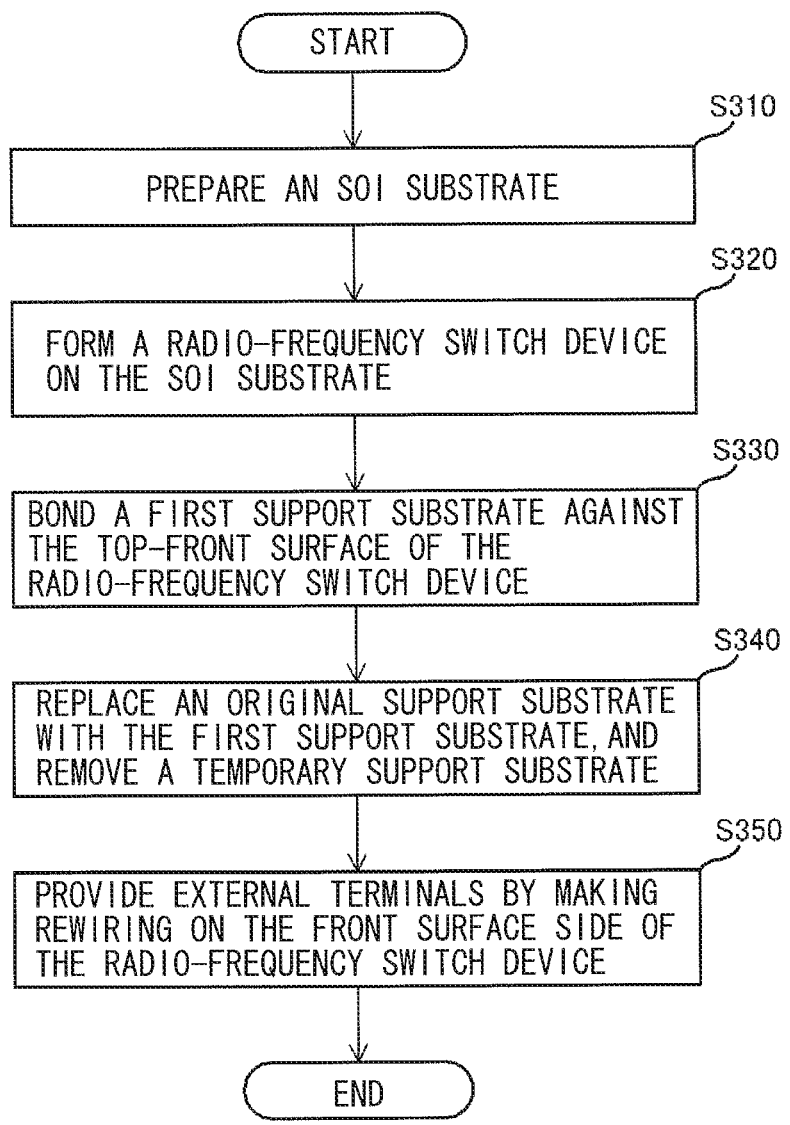
FIG. 16 is a flowchart showing a flow of a method of manufacturing a semiconductor device according to a third embodiment of the present disclosure.

FIG. 16 is a flowchart showing a flow of a method of manufacturing the semiconductor device according to the third embodiment of the present disclosure. FIG. 17 to FIG. 20 are each a cross-sectional view for explaining each step of the manufacturing method illustrated in FIG. 16. Hereinafter, the description is provided along a flow of the manufacturing method illustrated in FIG. 16.

It is to be noted that, because examples of a structure and a manufacturing method using a typical SOI substrate to be used for the radio-frequency switch device after completion of a wafer process are same with cases in FIGS. 9 and 10 that are explained in the above-described second embodiment of the present disclosure, any component parts essentially same as those of such cases according to the second embodiment are denoted with the same reference numerals, and the detailed descriptions are omitted as appropriate.

In the manufacturing method shown in FIG. 16, bonding of a temporary support substrate and removal of an original support substrate are carried out after performing steps S310 and S320 similar to the steps S210 and S220 according to the above-described second embodiment of the present disclosure (S330).

Figure 17:
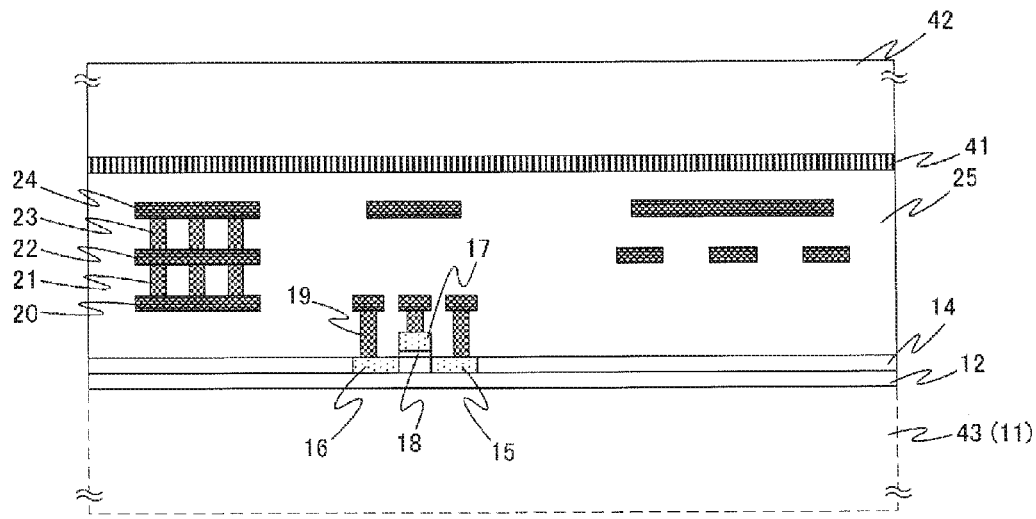
FIG. 17 is a cross-sectional view for explaining each step of the manufacturing method illustrated in FIG. 16.

FIG. 17 is a cross-sectional view in a case where the support substrate 11 for the SOI substrate is removed after bonding a temporary support substrate 42 against the top-front surface of the finished radio-frequency switch device. It is to be noted that this figure illustrates the removed support substrate 11 as a support substrate removal area 43.

As a material for the temporary support substrate 42, a material with less warpage that may be caused due to its own weight or a stress, such as silicon, ceramic, and quartz may be preferable. For a substrate with a caliber size of about eight inches, a thickness within a range of about 100 to about 1500 μm may be suitable. Further, from a viewpoint of prevention of any lack in adhesive uniformity, the planar property of the temporary support substrate 42 may be preferably equivalent to that of a mirror wafer of a silicon substrate.

The temporary support substrate 42 is bonded temporarily using a temporary adhesive agent 41. For the temporary adhesive agent 41, any type that is allowed to be easily peeled off using heat or light may be suitable. A type to be peeled off using heat may be suitable when a material for the temporary support substrate 42 is hard to transmit light therethrough like silicon and ceramic materials, and a type to be peeled off using light may be suitable when the material for the temporary support substrate 42 is easy to transmit light therethrough like a quartz material. Preferably, the temporary adhesive agent 41 may have a film thickness within a range of about 100 nm to about 10 μm.

The support substrate 11 that is an original support substrate for the SOI substrate is removed by a polishing work in the CMP method, a grinding work in the BGR method, or a wet etching process using a chemical solution such as a nitric fluoride-based solution. At this stage, the box layer 12 on the SOI substrate at the backside of the device is exposed.

Subsequently, the original support substrate is replaced with the crystal defect introduction substrate to which the first kind of crystal defect is introduced, and the temporary support substrate is removed (S340).

Figure 18:
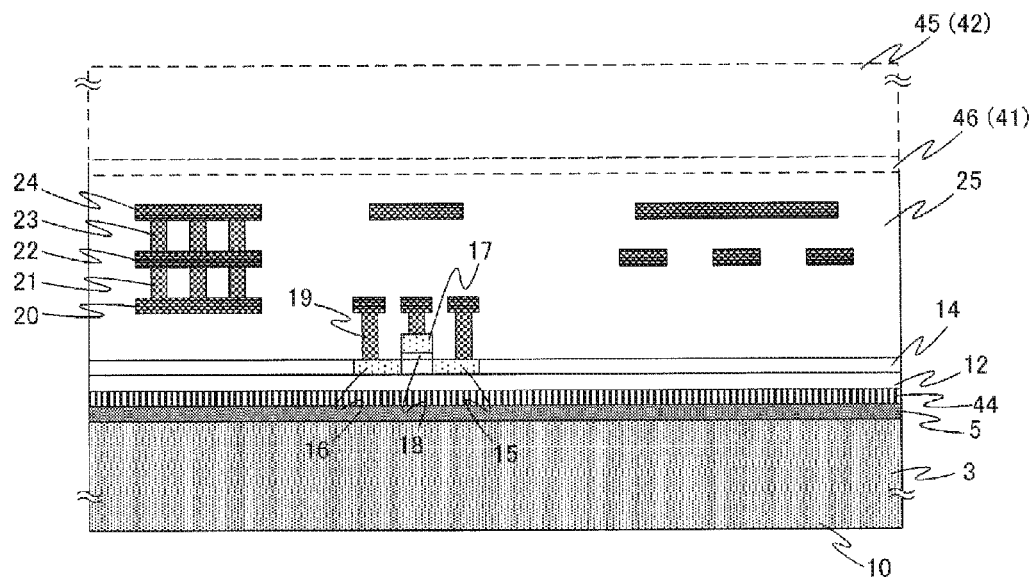
FIG. 18 is a cross-sectional view for explaining each step of the manufacturing method illustrated in FIG. 16.

FIG. 18 is a cross-sectional view showing a state where the temporary support substrate 42 and the temporary adhesive agent 41 are removed after replacing the support substrate 11 with the support substrate 10. This figure denotes removal traces of the temporary support substrate 42 and the temporary adhesive agent 41 as a temporary support substrate removal area 45 and a temporary adhesive agent removal area 46, respectively.

The support substrate 10 is bonded against the box layer 12 using an adhesive agent 44. Preferably, the adhesive agent 44 may have a dielectric tangent (tan δ) of the radio-frequency characteristics within a range of about 0.0001 to about 0.01 and a film thickness within a range of about 50 to about 1000 nm to ensure permanent bonding, and a candidate example for such an adhesive agent may include siloxane-based benzocyclobutene (BCB).

It is to be noted that, in this third embodiment of the present disclosure, the support substrate 10 is permanently bonded against the box layer 12 at the backside of the radio-frequency switch device using the adhesive agent 44, although a bonding method after exposure of the box layer 12 is not limited thereto, but a direct bonding without using an adhesive agent may be also permitted by performing a grinding work in the CMP method, the BGR method, or the like.

Thereafter, the temporary support substrate 42 and the temporary adhesive agent 41 are removed by performing heating or light irradiation depending on the characteristics of the temporary adhesive agent 41.

Finally, a thermal treatment may be preferably performed over a temperature range of about 100 to about 350 degrees centigrade for stabilizing an adhesive force between the support substrate 11 and the support substrate 10.

Next, external terminals are provided by making rewiring on the front surface side of the radio-frequency switch device (S350).

Figure 19:
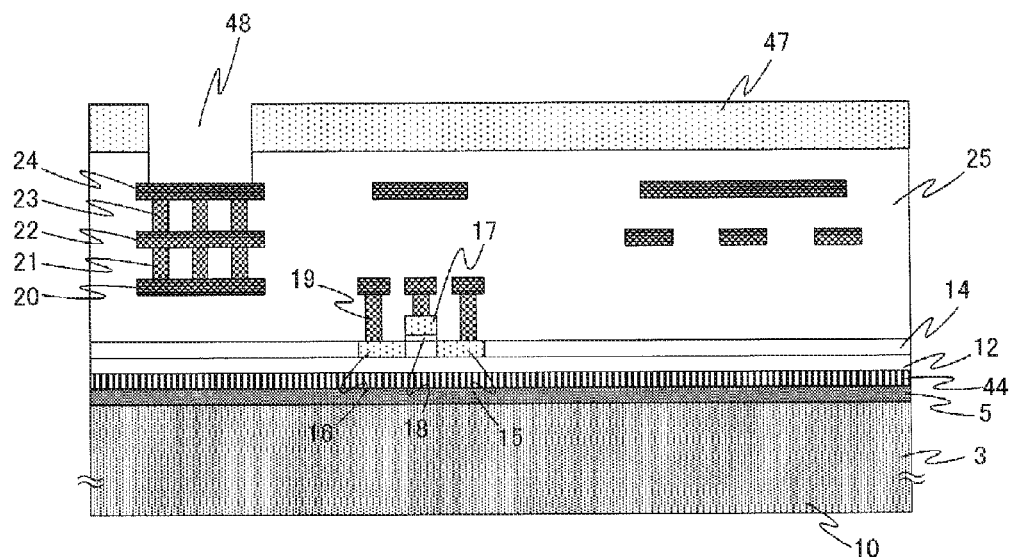
FIG. 19 is a cross-sectional view for explaining each step of the manufacturing method illustrated in FIG. 16.

FIG. 19 is a cross-sectional view in a case where a rewiring insulating film 47 and a metal wiring connection trench 48 are formed on the front surface side of the radio-frequency switch device.

Preferably, the rewiring insulating film 47 may be a silicon nitride film with a film thickness within a range of about 100 to about 5000 nm, and may be formed in a method such as a plasma CVD that is capable of generating the film over a temperature range from room temperature to about 300 degrees centigrade.

Following formation of the rewiring insulating film 47, the metal wiring connection trench 48 for rewiring with a diameter within a range of about 5 to 100 μm is etched as far as a third metal wiring layer 24 using lithography and dry etching techniques, thereby exposing the third metal wiring layer 24.

Figure 20:
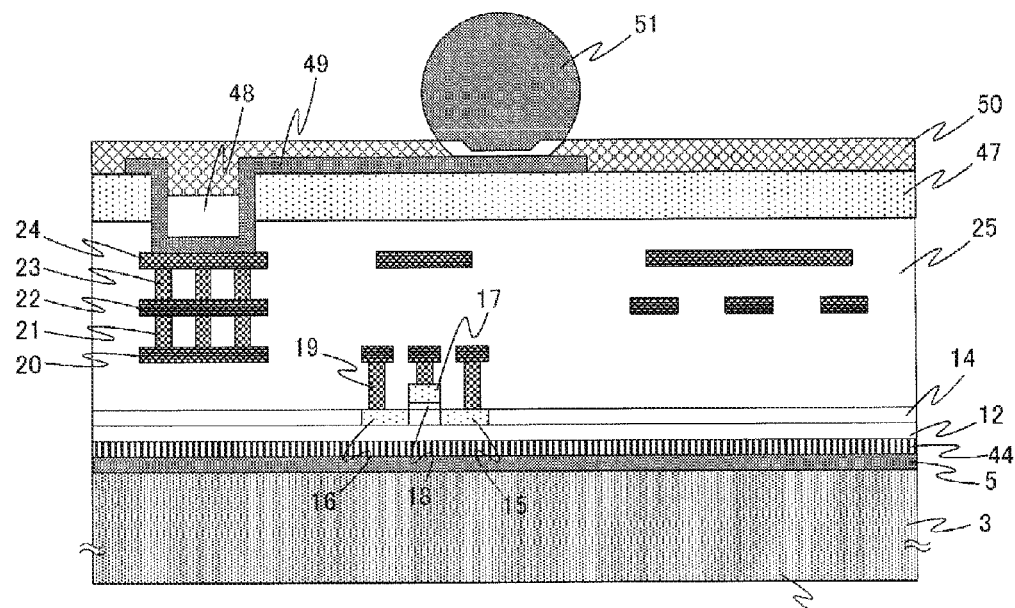
FIG. 20 is a cross-sectional view for explaining each step of the manufacturing method illustrated in FIG. 16.

FIG. 20 is a cross-sectional view showing a final form of the third embodiment of the present disclosure.

To achieve this final form, as a first step, a clean surface of the third metal wiring layer 24 that is located at the bottom of the metal wiring connection trench 48 is exposed using a reverse sputtering of argon, or any other techniques, and a titanium film with a thickness within a range of about 10 to about 200 nm and a copper film 49 with a thickness within a range of about 50 to about 500 nm are deposited in a sputtering method or the like to form an electrode for copper plating.

Thereafter, rewiring is carried out with a line width within a range of about 5 to 100 μm using a lithography technique. Any region to be excluded from the rewiring is electrically insulated with a photosensitive organic film, such as a resist film and a film membrane, and a metallic copper film 49 is precipitated with a thickness within a range of about 1 to 10 μm in an electrolytic method to plate the metallic copper 49 at a portion to be rewired.

Further, when the photosensitive organic film formed using the lithography technique and the titanium film formed in the sputtering method are removed in turn utilizing a wet or dry etching technique, a rewiring metal wiring layer 49 with a film thickness for rewiring within a range of about 1 to 10 μm and a line width within a range of about 5 to 100 μm is formed.

Subsequently, photosensitive polyimide is coated as a rewiring protective film 50, and a pilot hole of a solder ball 51 for a chip electrode is drilled using the lithography technique to perform curing under a nitrogen atmosphere for about 60 minutes over a temperature range of about 250 to about 300 degrees centigrade.

Finally, an organic insulating film that is formed by curing inside the pilot hole of the solder ball 51 for the chip electrode is removed in the dry etching technique such as an oxygen plasma method, and the solder ball 51 for the chip electrode is formed on a clean surface of the metallic copper 49. Such a step brings the rewiring to completion.

It is to be noted that, in the third embodiment of the present disclosure described thus far, the rewiring is made on the front surface side of the radio-frequency switch device via a contact, although an insulating film may be formed as a protective film on the front surface side of the device to make rewiring through a TSV that is formed at the support substrate 10 side.

In the semiconductor device according to the third embodiment of the present disclosure that is configured in the above-described manners, it is possible to achieve the radio-frequency switch device using the SOT substrate similar to currently-available one by the use of the support substrate 10. In the case of a shape similar to a currently-available substrate, the semiconductor device according to the third embodiment of the present disclosure may be disadvantageous in terms of heat dissipation as compared with the semiconductor device according to the second embodiment of the present disclosure, although it ensures that a thermal escapeway is obtained for dissipating heat arising instantaneously like a heat sink.

(D) Fourth Embodiment

Next, the description is provided on a fourth embodiment of the present disclosure. In the fourth embodiment of the present disclosure, in a radio-frequency switch device using an SOT substrate, an original support substrate for the SOT substrate is also replaced with a crystal defect introduction substrate after bonding the crystal defect introduction substrate against the front surface of the radio-frequency switch device, and thereafter rewiring is made via a TSV for the crystal defect introduction substrate at the backside of the radio-frequency switch device. Hereinafter, the description is provided on an example of a manufacturing method and a structure of such a semiconductor device.

Figure 21:
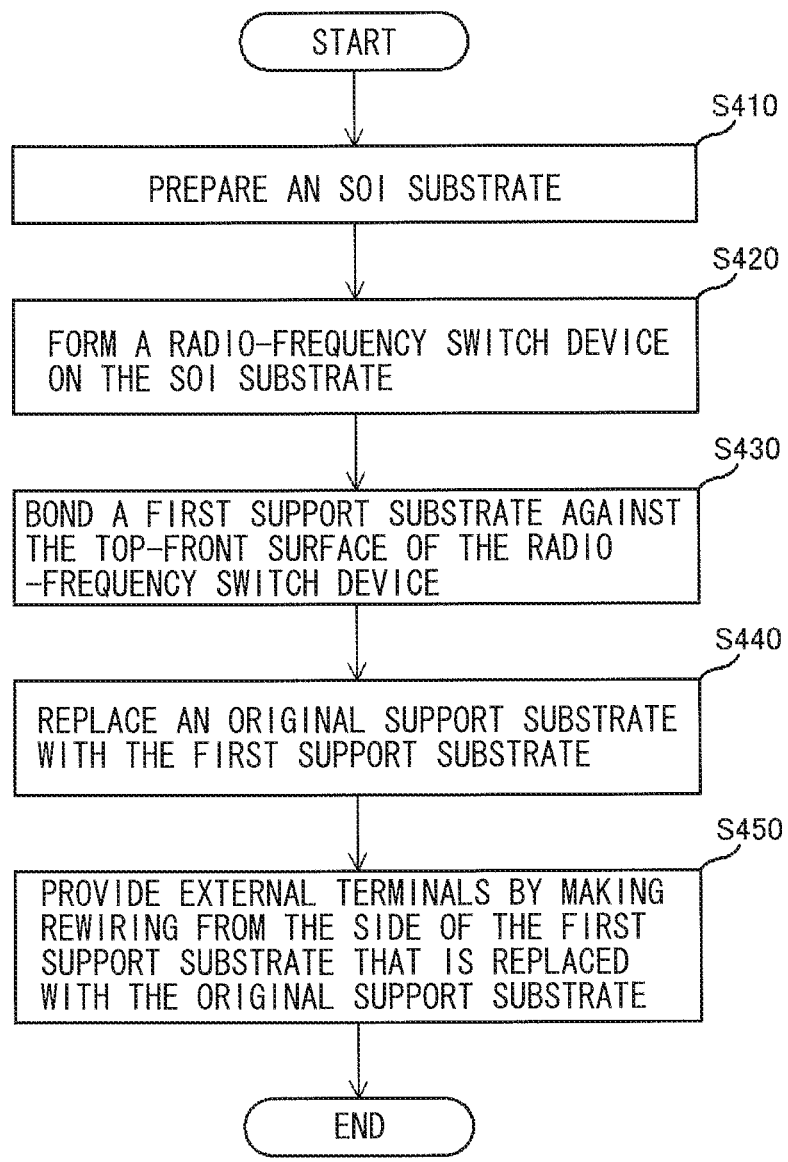
FIG. 21 is a flowchart showing a flow of a method of manufacturing a semiconductor device according to a fourth embodiment of the present disclosure.

FIG. 21 is a flowchart showing a flow of a method of manufacturing the semiconductor device according to the fourth embodiment of the present disclosure. FIG. 22 to FIG. 25 are each a cross-sectional view for explaining each step of the manufacturing method illustrated in FIG. 21. Hereinafter, the description is provided along a flow of the manufacturing method illustrated in FIG. 21.

It is to be noted that, because examples of a structure and a manufacturing method using a typical SOI substrate to be used for the radio-frequency switch device after completion of a wafer process are same with cases in FIGS. 9 and 10 that are explained in the above-described second embodiment of the present disclosure, any component parts essentially same as those of such cases according to the second embodiment are denoted with the same reference numerals, and the detailed descriptions are omitted as appropriate.

In the manufacturing method shown in FIG. 21, the crystal defect introduction substrate is bonded against the top-front surface of the radio-frequency switch device after performing steps S410 and S420 similar to the steps S210 and S220 according to the above-described second embodiment of the present disclosure (S430).

Figure 22:
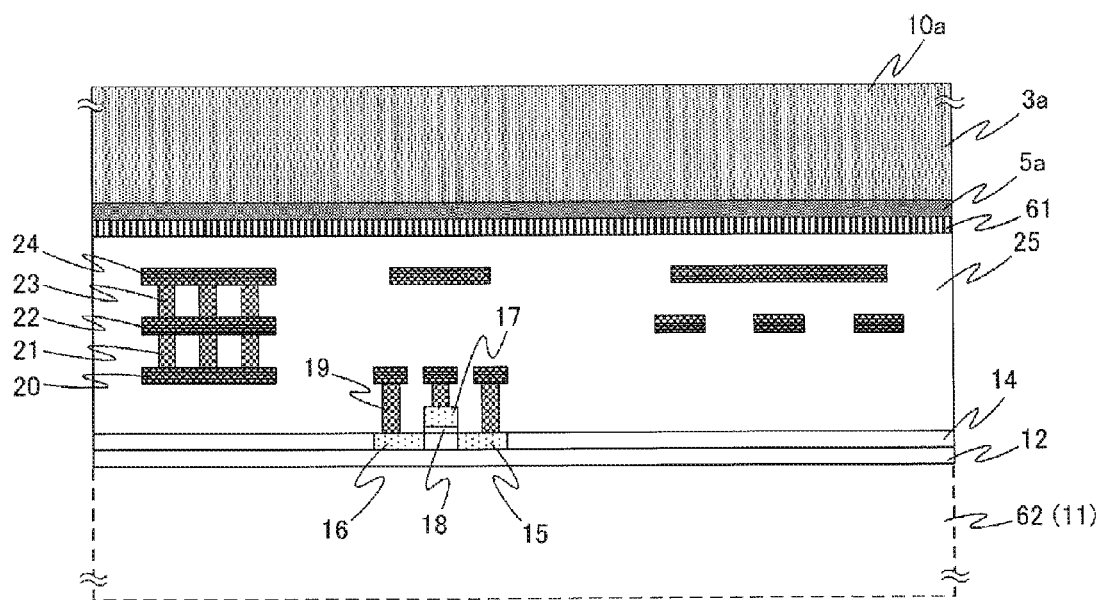
FIG. 22 is a cross-sectional view for explaining each step of the manufacturing method illustrated in FIG. 21.

FIG. 22 is a cross-sectional view in a case where the support substrate 11 for the SOI substrate is removed after bonding a support substrate 10*a* as the crystal defect introduction substrate against the front surface of the finished radio-frequency switch device. The support substrate 10a is same as the support substrate 10 that is fabricated in the above-described first embodiment of the present disclosure, and is configured in a double layer having a crystal defect 3a and a shallow crystal defect 5a, in which the crystal defect 3a is similar to the crystal defect 3.

FIG. 22 illustrates a state where the support substrate 10 according to the above-described first embodiment of the present disclosure is bonded against the top-front surface of the radio-frequency switch device using a first adhesive agent 61. It is to be noted that FIG. 22 shows a support substrate removal area 62 of the SOI substrate at a location where the support substrate 11 is removed.

Preferably, the first adhesive agent 61 in use for bonding may have a capability of permanently bonding the support substrate 10 with the radio-frequency switch device, as well as a dielectric tangent (tan δ) of the radio-frequency characteristics within a range of about 0.0001 to about 0.01 and a film thickness within a range of about 50 to about 1000 nm, and a candidate example for such an adhesive agent may include siloxane-based benzocyclobutene (BCB). After bonding of the support substrate 10, an adhesive force may be preferably stabilized by performing a thermal treatment over a temperature range of about 100 to about 350 degrees centigrade.

It is to be noted that, in this fourth embodiment of the present disclosure, the support substrate 10 is bonded with the radio-frequency switch device using the first adhesive agent 61, although a bonding method is not limited thereto, but a direct bonding without using an adhesive agent may be also permitted after planarizing the front surface by performing a polishing work in the CMP method or the BGR method.

It is possible to remove the support substrate 11 for the SOI substrate by a polishing work in the CMP method, a grinding work in the BGR method, or a wet etching process using a chemical solution such as a nitric fluoride-based solution. At this stage, the box layer 12 on the SOI substrate at the backside of the device is exposed.

Subsequently, the support substrate 11 as an original support substrate is replaced with a support substrate 10b as a crystal defect introduction substrate (S440).

Figure 23:
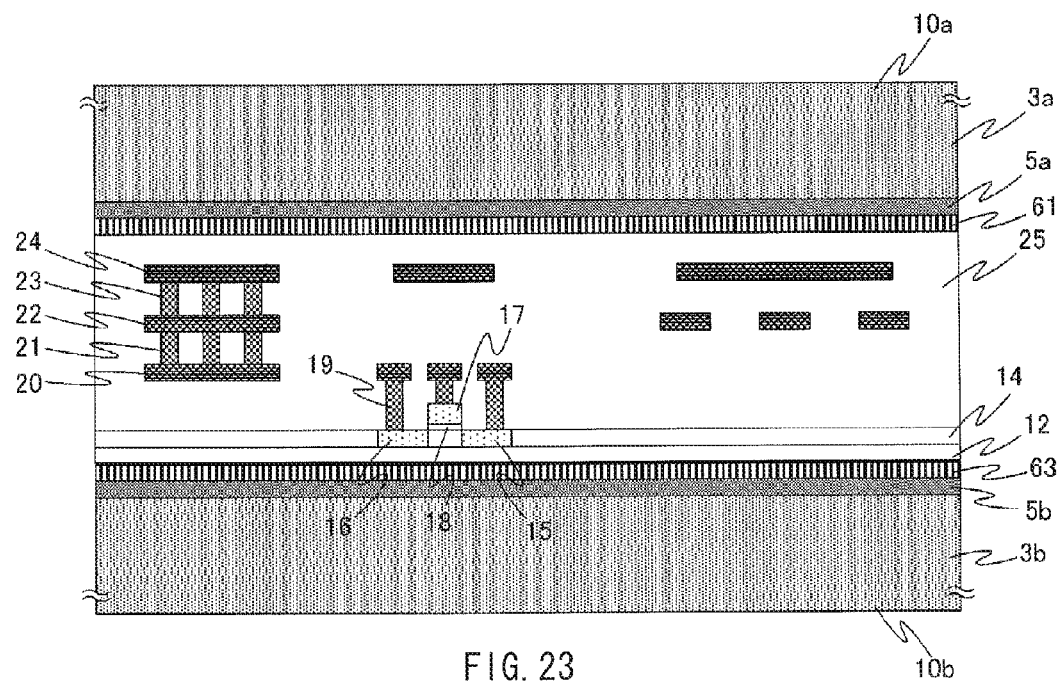
FIG. 23 is a cross-sectional view for explaining each step of the manufacturing method illustrated in FIG. 21.

The support substrate 10b of the fourth embodiment is manufactured using the method of manufacturing a semiconductor device according to the above-described first embodiment of the present disclosure. In particular, the crystal defect 3b in the support substrate 10b is similar to the crystal defect 3 in FIG. 3. The crystal defect 3b is formed using the method according to the above-described first embodiment of the present disclosure. The shallow crystal defect 5b is similar to the shallow crystal defect 5 in FIGS. 4 and 5. The shallow crystal defect 5b is formed using the method according to the above-described first embodiment of the present disclosure. FIG. 23 is a cross-sectional view in a case where the support substrate 11 is replaced with the support substrate 10b. The support substrate 10b is permanently bonded against the box layer 12 at the backside of the radio-frequency switch device using a second adhesive agent 63. However, a method of bonding the box layer 12 and the support substrate 10b is not limited thereto, but, for example, direct bonding using a plasma method or any other techniques may be also permitted after exposure of the box layer 12.

As with the first adhesive agent 61, for ensuring permanent bonding, the second adhesive agent 63 in use for bonding may preferably have dielectric tangent (tan δ) of the radio-frequency characteristics within a range of about 0.0001 to about 0.01 and a film thickness within a range of about 50 to about 1000 nm, and a candidate example for such an adhesive agent may include siloxane-based benzocyclobutene (BCB). Subsequently, a thermal treatment may be preferably performed over a temperature range of about 100 to about 350 degrees centigrade for stabilizing an adhesive force.

Thereafter, external terminals are provided by making rewiring from the side of the crystal defect introduction substrate that is replaced with the original support substrate for the SOI substrate (S450).

Figure 24:
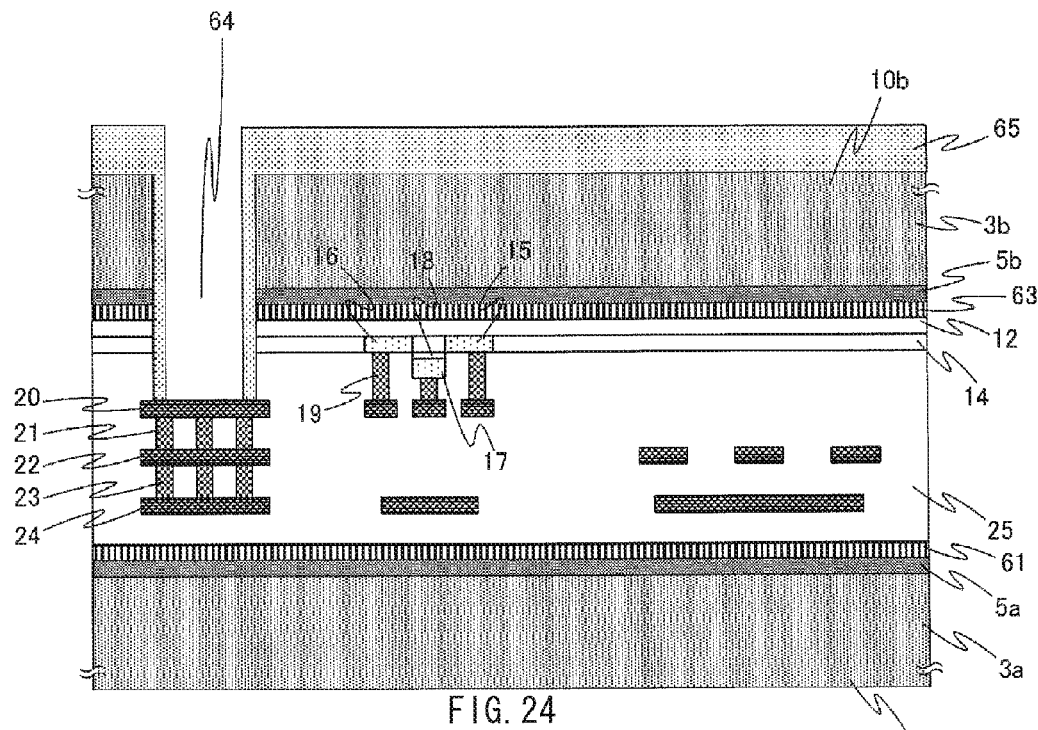
FIG. 24 is a cross-sectional view for explaining each step of the manufacturing method illustrated in FIG. 21.

FIG. 24 is a cross-sectional view in a case where a TSV 64 for metal wiring connection and a rewiring insulating film 65 are formed from the support substrate 10b side after replacing the support substrate 11 with the support substrate 10b.

To form such a shape, to start with, the TSV 64 for metal wiring connection with a diameter within a range of about 5 to 100 μm is formed by etching as far as the first metal wiring layer 20 using lithography and dry etching techniques to expose the first metal wiring layer 20.

Next, to form an electrically insulating film for the support substrate 10b, the rewiring insulating film 65 is formed with a thickness within a range of about 100 nm to 20 μm using a plasma CVD method and the like that allow to form a film over a temperature range from room temperature to about 300 degrees centigrade.

Because the rewiring insulating film 65 is formed on the front surface of the first metal wiring layer 20 at the bottom of the TSV 64 for metal wiring connection as well, when a whole-area etch back is carried out using the dry etching technique such as RIE (Reactive Ion Etching), the rewiring insulating film 65 that is formed on the front side of the first metal wiring layer 20 is etched, and a structure is formed where the rewiring insulating film 65 with a thickness within a range of about 50 to 10 μm is selectively left on a sidewall of the TSV 64 for metal wiring connection.

Figure 25:
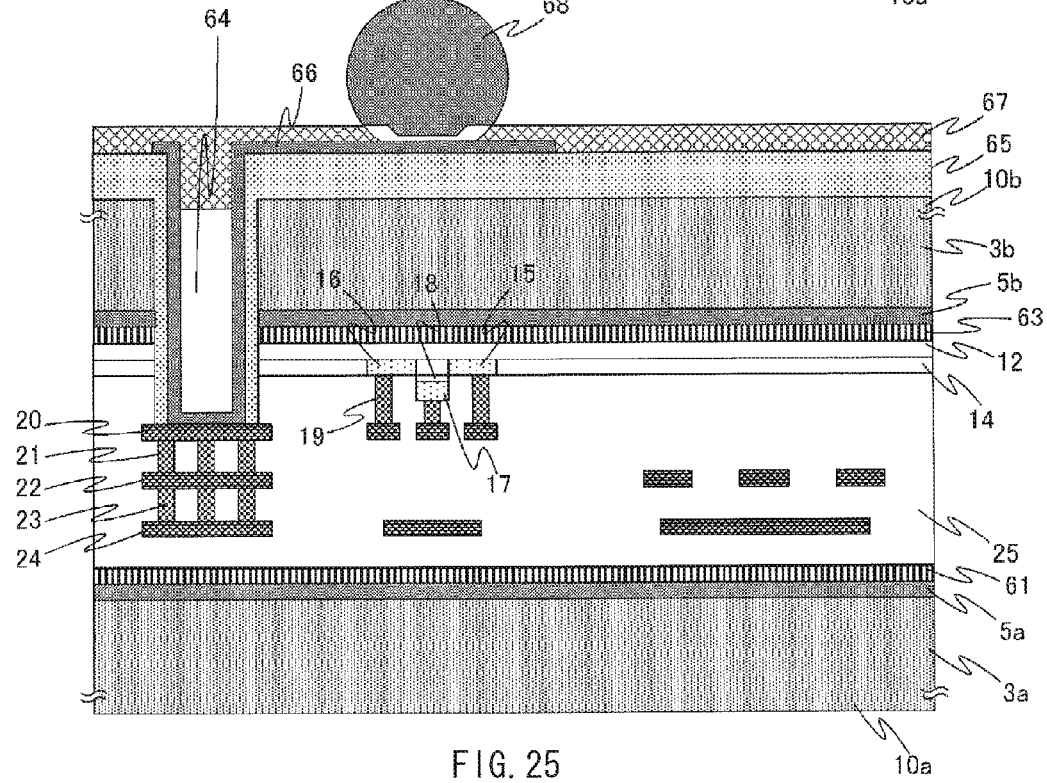
FIG. 25 is a cross-sectional view for explaining each step of the manufacturing method illustrated in FIG. 21.

FIG. 25 is a cross-sectional view showing a final form of the semiconductor device according to the fourth embodiment of the present disclosure. To achieve this final form, as a first step, a clean surface of the first metal wiring layer 20 that is located at the bottom of the TSV 64 for metal wiring connection is exposed using a reverse sputtering of argon, or any other techniques, and a titanium film with a thickness within a range of about 10 to about 200 nm and a copper film 66 with a thickness within a range of about 50 to about 500 nm are deposited in a sputtering method or the like to form an electrode for copper plating.

Thereafter, rewiring is carried out with a line width within a range of about 5 to 100 μm using a lithography technique. Any region to be excluded from the rewiring is electrically insulated with a photosensitive organic film, such as a resist film and a film membrane, and a metallic copper film 66 is precipitated with a thickness within a range of about 1 to 10 μm in an electrolytic method to plate the metallic copper 66 at a portion to be rewired.

Further, when the photosensitive organic film formed using the lithography technique and the titanium film formed in the sputtering method are removed utilizing a wet or dry etching technique, a rewiring metal wiring layer 66 with a film thickness for rewiring within a range of about 1 to 10 μm and a line width within a range of about 5 to 100 μm is formed.

Subsequently, photosensitive polyimide is coated as a rewiring protective film 67, and a pilot hole of a solder ball 68 for a chip electrode is drilled using the lithography technique to perform curing under a nitrogen atmosphere for about 60 minutes over a temperature range of about 250 to about 300 degrees centigrade.

Finally, an organic insulating film that is formed by curing inside the pilot hole of the solder ball 68 for the chip electrode is removed in the dry etching technique such as an oxygen plasma method, and the solder ball 68 for the chip electrode is formed on a clean surface of the metallic copper 66. Such a step brings the rewiring to completion.

It is to be noted that, in this embodiment of the present disclosure, the rewiring is made via the TSV from the side of the support substrate 10b that is bonded against the back surface side of the radio-frequency switch device, although the rewiring may be made via the TSV from the side of the support substrate 10a that is bonded against the front surface side of the radio-frequency switch device.

In the semiconductor device according to the fourth embodiment of the present disclosure that is fabricated in the above-described manners, because the support substrate 10 is bonded against both sides of a semiconductor layer where the radio-frequency switch device is formed, two heat dissipation paths are assured, which is more advantageous in the heat dissipation effect as compared with the above-described second and third embodiments of the present disclosure.

(E) Fifth Embodiment

Figure 26:
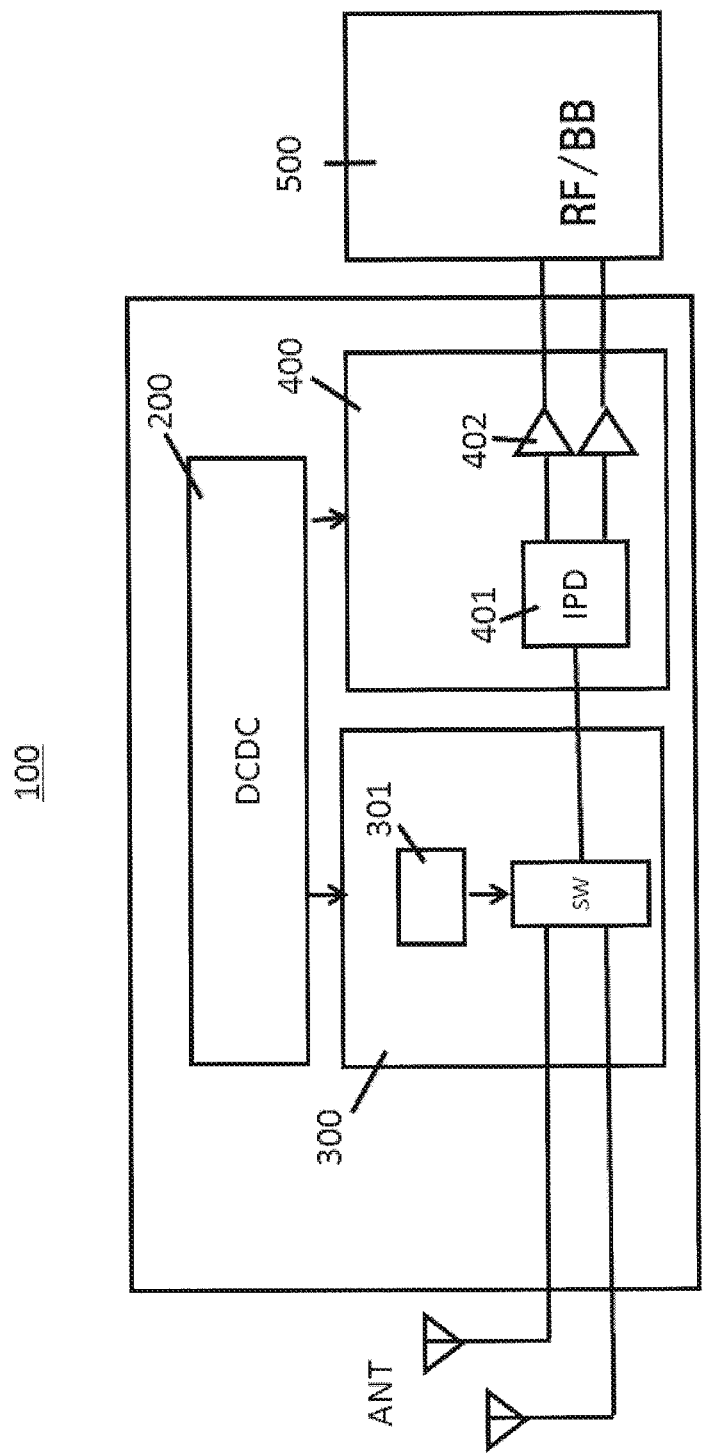
FIG. 26 is a block diagram for explaining a radio-frequency module according to a fifth embodiment of the present disclosure.

FIG. 26 illustrates an example of an RF (Radio Frequency) module (a radio-frequency module, or an "antenna switch module") 100 according to a fifth embodiment of the present disclosure. The RF module 100 is provided with an IC (Integrated Circuit) 300. The IC 300 is mounted with the SOI substrate and the radio-frequency switch device. The SOI substrate includes any one of the support substrates 10, 10a, and 10b according to the first embodiment to the fourth embodiment described above. The RF module 100 is provided, in addition to the IC 300, with a DCDC converter 200 and an FEM (Front End Module) 400. The DCDC converter 200 provides each of the IC 300 and the FEM 400 with a voltage. The IC 300 includes a switch SW and a logic circuit 301 that controls the switch SW. In the IC 300, the switch SW receives a wireless signal from an antenna ANT, and selects an RF signal. The FEM 400 includes an IPD (Intelligent Power Device) 401 and an inverter 402, and amplifies the RF signal selected in the IC 300. For example, the IPD 401 may be an element such as a diode. The signal output from the FEM 400 is supplied to a signal processing section 500 to be converted into a digital signal. The signal processing section 500 may include various ICs such as an RF section and a BB (Base Band) section. It is to be noted that, in the fifth embodiment, the radio-frequency switch device that utilizes the SOI substrate is applied to a receiver module, although the technology is not limited thereto. In one embodiment, the radio-frequency switch device that utilizes the SOI substrate described above may be applied to a transmitter module.

(F) Summary of Example Embodiments

According to the second to fourth embodiments of the present disclosure that are described thus far, in the semiconductor device having the radio-frequency switch device on the SOI substrate, the crystal defect 3 as a first kind of crystal defect is formed uniformly over a whole surface of the support substrate 10 for the SOI substrate. As a result, this makes it possible to prevent any thermal destruction due to self-heating of MOSFETs in antenna switches to be formed on the SOI substrate for controlling high power outputs for radio frequencies, while maintaining excellent harmonic distortion characteristics. Also, according to the fifth embodiment of the present disclosure, the radio-frequency module is mounted with the radio-frequency switch device that utilizes the SOI substrate described above. As a result, this makes it possible to achieve a radio-frequency module having higher reliability.

It is to be noted that the present technology is not limited to the above-described embodiments and modification examples, but it also encompasses a configuration where each configuration disclosed in the above-described embodiments and modification examples is replaced with each other or combination thereof is changed, a configuration where each configuration disclosed in a known technology as well as the above-described embodiments and modification examples is replaced with each other or combination thereof is changed, and the like. Further, a technical scope of the present technology is not limited to the above-described embodiments, but it covers elements described in claims and equivalents thereof.

Furthermore, the technology encompasses any possible combination of some or all of the various embodiments described herein and incorporated herein.

It is possible to achieve at least the following configurations from the above-described example embodiments of the disclosure.

(1) A semiconductor device, including:
a silicon-on-insulator substrate including a support substrate, the support substrate including a first crystal defect having a uniform density all over the support substrate; and
a radio-frequency switch device provided on the silicon-on-insulator substrate.

(2) The semiconductor device according to (1), wherein a region other than the support substrate does not include the first crystal defect.

(3) The semiconductor device according to (1) or (2), wherein the support substrate is bonded through adhesive attachment with a semiconductor layer that includes an element layer and a wiring layer, the element layer being provided with the radio-frequency switch device, and the wiring layer being provided with a metallic wire.

(4) The semiconductor device according to (3), wherein the radio-frequency switch device is provided in the semiconductor layer in proximity to a surface of the semiconductor layer, the surface being on an opposite side of a surface, of the semiconductor layer, in contact with the support substrate.

(5) The semiconductor device according to (3), wherein the radio-frequency switch device is provided in the semiconductor layer in proximity to a surface, of the semiconductor layer, in contact with the support substrate.

(6) The semiconductor device according to (3), wherein the support substrate is bonded through the adhesive attachment on both sides of the semiconductor layer.

(7) The semiconductor device according to any one of (3) to (6), wherein rewiring is made for the semiconductor layer from a surface, of the semiconductor layer, close to the radio-frequency switch device.

(8) The semiconductor device according to any one of (3) to (6), wherein rewiring is made for the semiconductor layer from a surface, of the semiconductor layer, far from the radio-frequency switch device.

(9) The semiconductor device according to any one of (3) to (8), wherein rewiring is made for the semiconductor layer via a through-silicon via that runs through the support substrate to the semiconductor layer.

(10) The semiconductor device according to any one of (1) to (9), wherein the support substrate includes a crystal defect layer on a side, of the support substrate, bonded with the semiconductor layer, the crystal defect layer including a second crystal defect.

(11) The semiconductor device according to (10), wherein the second crystal defect of the crystal defect layer is provided, through an ion implantation of one of inert gas, carbon, and silicon, in a depth range of about 100 nm to several micrometers from a surface on the side bonded with the semiconductor layer.

(12) The semiconductor device according to any one of (1) to (11), wherein the first crystal defect of the support substrate is provided through irradiation of an electron beam and has a range of the density of about $1\times10^{14}$ pieces/cubic centimeter to about $1\times10^{16}$ pieces/cubic centimeter.

(13) The semiconductor device according to any one of (1) to (12), wherein the support substrate includes a substrate in which the first crystal defect is provided on a silicon substrate having an oxygen concentration within a range of about $1\times10^{15}$ atoms/cubic centimeter to about $1\times10^{17}$ atoms/cubic centimeter, having a specific resistance within a range of about 100 Ωcm to about $1\times10^{5}$ Ωcm, and being manufactured in an floating zone method, or includes a substrate in which the first crystal defect is provided on a silicon substrate having a specific resistance within a range of about 100 Ωcm to about $1\times10^{5}$ Ωcm and in which silicon is epitaxially grown on a substrate manufactured in a Czochralski method or an magnetic-field-applied Czochralski method.

(14) An antenna switch module, including the semiconductor device according to any one of (1) to (13).

(15) A method of manufacturing a semiconductor device, the method including:
forming a semiconductor layer on a silicon-on-insulator substrate through laminating an element layer and a wiring layer in sequence on the silicon-on-insulator substrate, the element layer including a radio-frequency switch device, and the wiring layer including a metal wire;
fabricating a crystal defect introduction substrate formed with a first crystal defect having a uniform density all over the crystal defect introduction substrate; and
bonding the fabricated crystal defect introduction substrate with a surface of the semiconductor layer through adhesive attachment.

(16) The method of manufacturing the semiconductor device according to (15), wherein, in the bonding the fabricated crystal defect introduction substrate, an original support substrate of the silicon-on-insulator substrate is removed after the crystal defect introduction substrate is bonded with the surface, on a wiring layer side, of the semiconductor layer through the adhesive attachment.

(17) The method of manufacturing the semiconductor device according to (15), wherein, in the bonding the fabricated crystal defect introduction substrate,
an original support substrate of the silicon-on-insulator substrate is removed after a temporary support substrate is bonded with the surface, on a wiring layer side, of the semiconductor layer through the adhesive attachment,
the crystal defect introduction substrate is bonded, instead of the original support substrate, with the surface, on an element layer side, of the semiconductor layer through the adhesive attachment, and
the temporary support substrate is then removed.

(18) The method of manufacturing the semiconductor device according to (15), wherein, in the bonding the fabricated crystal defect introduction substrate,
an original support substrate of the silicon-on-insulator substrate is removed after bonding the crystal defect introduction substrate with the surface, on a wiring layer side, of the semiconductor layer through the adhesive attachment, and
the crystal defect introduction substrate is bonded, instead of the original support substrate, also with the surface, on an element layer side, of the semiconductor layer through the adhesive attachment.

(19) The method of manufacturing the semiconductor device according to (15), wherein, in the bonding the fabricated crystal defect introduction substrate,
an original support substrate of the silicon-on-insulator substrate is removed after bonding a temporary support substrate with the surface, on a wiring layer side, of the semiconductor layer through the adhesive attachment,
the crystal defect introduction substrate is bonded, instead of the original support substrate, with the surface, on an element layer side, of the semiconductor layer through the adhesive attachment, and
the crystal defect introduction substrate is also bonded with the surface, on the wiring layer side, of the semiconductor layer through the adhesive attachment.

[1] A semiconductor device having a radio frequency switch, the semiconductor device comprising:
a metal wiring insulating film bonded to a silicon substrate; and
crystal defects throughout the silicon substrate; and
a first crystal defect layer extending into the silicon substrate from a surface of the silicon substrate, crystal defects formed throughout the first crystal defect.

[2] The semiconductor device according to [1], further comprising:
oxygen throughout the silicon substrate, a concentration of the oxygen in the silicon substrate being within a range of about 1×1015 to about 1×1017 atoms/cubic centimeter.

[3] The semiconductor device according to [1] or [2], further comprising:
ions of an inert gas within the first crystal defect layer.

[4] The semiconductor device according to any one of [1] to [3], further comprising:
an adhesive agent configured to bond the surface of the silicon substrate to the metal wiring insulating film, the adhesive agent being between the first crystal defect layer and the metal wiring insulating film.

[5] The semiconductor device according to any one of [1] to [4], wherein the metal wiring insulating film is between the silicon substrate and a support substrate, the support substrate being a material from the group consisting of silicon, ceramic, and quartz.

[6] The semiconductor device according to any one of [1] to [5], further comprising:
a metallic copper film touching a first metal wiring layer, the first metal wiring layer and a second metal wiring layer being in the metal wiring insulating film.

[7] The semiconductor device according to [6], further comprising:
a metal wiring connection plug between the first metal wiring layer and the second metal wiring layer, the metal wiring connection plug touching the first metal wiring layer and the second metal wiring layer.

[8] The semiconductor device according to [7], further comprising:
a rewiring insulating film between the metal wiring insulating film and a rewiring protective film, a portion of the metallic copper film being between the rewiring protective film and the rewiring insulating film.

[9] The semiconductor device according to [8], further comprising:
a solder ball extending through the rewiring protective film, the portion of the metallic copper film touching the solder ball.

[10] The semiconductor device according to any one of [1] to [9], further comprising:
an element separation layer between a buried oxide layer and the metal wiring insulating film, drain and source electrodes of a transistor being within the element separation layer.

[11] The semiconductor device according to [10], wherein the buried oxide layer is between the rewiring insulating film and the element separation layer.

[12] The semiconductor device according to [10] or [11], wherein the buried oxide layer is between the first crystal defect layer and the element separation layer.

[13] The semiconductor device according to any one of [1] to [12], further comprising:
a second crystal defect layer within the silicon substrate, the second crystal defect layer being between the metal wiring insulating film and the first crystal defect layer.

[14] The semiconductor device according to [13], wherein the second crystal defect layer extends from the surface of the silicon substrate into the first crystal defect layer, the first crystal defect layer differing from the second crystal defect layer.

[15] The semiconductor device according to [13] or [14], wherein the first crystal defect layer extends from the second crystal defect layer to an opposite surface of the silicon substrate.

[16] An antenna switch module comprising:
the semiconductor device according to any one of [1] to [15];
an integrated circuit mounted with the radio-frequency switch device and the silicon substrate.

[17] A method of manufacturing a semiconductor device, the method comprising: forming crystal defects throughout a silicon substrate, radiation or a diffusion being used to form the crystal defects, and thereafter;
implanting ions into a surface of the silicon substrate to form a crystal defect layer, the crystal defect layer extending from the surface of the silicon substrate into the crystal defects.

[18] The method according to [17], wherein the radiation is from the group consisting of electron beam irradiation, gamma ray radiation, and neutron ray radiation.

[19] The method according to [17] or [18], wherein a heavy-metal material is diffused during the diffusion.

[20] The method according to any one of [17] to [19], wherein a process to grow or fabricate the silicon substrate is from the group consisting of a Floating Zone method, a Czochralski method, and a Magnetic-Field-applied Czochralski method.

[21] The method according to any one of [17] to [20], wherein a concentration of oxygen within the silicon substrate is about $1\times10^{15}$ to about $1\times10^{17}$ atoms/cubic centimeter, the silicon substrate having of about 100 to about $1\times10^5$ Ωcm.

[22] The method according to any one of [17] to [21], further comprising: bonding the crystal defect layer to a metal wiring insulating film, first and second metal wiring layers being in the metal wiring insulating film.

[23] The method according to [22], further comprising:
forming a metal wiring connection trench through a rewiring insulating film, the metal wiring connection trench terminating at the first metal wiring layer.

[24] The method according to [23], further comprising:
depositing a metallic copper film into the metal wiring connection trench, the metallic copper film touching the first metal wiring layer.

[25] The method according to [24], further comprising:
forming a rewiring protective film on the rewiring insulating film, a portion of the metallic copper film being between the rewiring protective film and the rewiring insulating film.

[26] The method according to [24] or [25], wherein a support substrate is between the metal wiring insulating film and the rewiring insulating film, another silicon substrate being the support substrate.

[27] The method according to [26], wherein other crystal defects are throughout the support substrate, another crystal defect layer extending from the surface of the support substrate into the other crystal defects.

[28] The method according to any one of [24] to [27], further comprising: forming a pilot hole through the rewiring protective film, the pilot hole exposing the portion of the metallic copper film.

[29] The method according to [28], further comprising:
depositing a solder ball in the pilot hole, the portion of the metallic copper film touching the solder ball.

The present disclosure contains subject matter related to that disclosed in Japanese Priority Patent Application JP 2012-245161 filed in the Japan Patent Office on Nov. 7, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device, comprising:
a silicon-on-insulator substrate;
a radio-frequency switch device provided on the silicon-on-insulator substrate; and
a support substrate provided over a surface of the radio-frequency switch device, the support substrate including first crystal defect; and
wherein a part of the silicon-on insulator substrate changes to other substrate including second crystal defect.

2. The semiconductor device according to claim 1, wherein the support substrate is bonded through adhesive attachment with the silicon-on-insulator substrate that includes an element layer and a wiring layer, the element layer being provided with the radio-frequency switch device, and the wiring layer being provided with a metallic wire.

3. The semiconductor device according to claim 2, wherein the radio-frequency switch device is provided in the silicon-on-insulator substrate in proximity to a surface of the silicon-on-insulator substrate, the surface being on an opposite side of a surface, of the silicon-on-insulator substrate, in contact with the support substrate.

4. The semiconductor device according to claim 2, wherein the radio-frequency switch device is provided in the silicon-on-insulator substrate in proximity to a surface, of the silicon-on-insulator substrate, in contact with the support substrate.

5. The semiconductor device according to claim 2, wherein the support substrate is bonded through the adhesive attachment on both sides of the silicon-on-insulator substrate.

6. The semiconductor device according to claim 2, wherein rewiring is made for the silicon-on-insulator substrate from a surface, of the silicon-on-insulator substrate, close to the radio-frequency switch device.

7. The semiconductor device according to claim 2, wherein rewiring is made for the silicon-on-insulator substrate from a surface, of the silicon-on-insulator substrate, far from the radio-frequency switch device.

8. The semiconductor device according to claim 2, wherein rewiring is made for the silicon-on-insulator substrate via a through-silicon via.

9. The semiconductor device according to claim 1, wherein the first crystal defect is provided, through an ion implantation of one of inert gas, carbon, and silicon, in a depth range of about 100 nm to several micrometers from a surface on the side bonded with the semiconductor layer.

10. The semiconductor device according to claim 1, wherein the first crystal defect of the support substrate is provided through irradiation of an electron beam and has a range of the density of about $1 \times 10^{14}$ pieces/cubic centimeter to about $1 \times 10^{16}$ pieces/cubic centimeter.

11. The semiconductor device according to claim 1, wherein the support substrate comprises a substrate in which the first crystal defect is provided on the $1 \times 10^{15}$ atoms/cubic centimeter to about $1 \times 10^{17}$ atoms/cubic centimeter, having a specific resistance within a range of about 100 Ωcm to about $1 \times 10^5$ Ωcm, and being manufactured in an floating zone method, or comprises a substrate in which the first crystal defect is provided on a silicon substrate having a specific resistance within a range of about 100 Ωcm to about $1 \times 10^5$ Ωcm and in which silicon is epitaxially grown on a substrate manufactured in a Czochralski method or an magnetic-field-applied Czochralski method.

12. An antenna switch module provided with a semiconductor device, the semiconductor device comprising:
 a silicon-on-insulator substrate;
 a radio-frequency switch device provided on the silicon-on-insulator substrate; and
 a support substrate provided over a surface of the radio-frequency switch device, the support substrate including a first crystal defect; and
 wherein a part of the silicon-on insulator substrate changes to another substrate including a second crystal defect.

13. The antenna switch module according to claim 12, wherein a region other than the support substrate does not include a crystal defect layer.

14. The antenna switch module according to claim 12, wherein the support substrate is bonded through adhesive attachment with the silicon-on-insulator substrate that includes an element layer and a wiring layer, the element layer being provided with the radio-frequency switch device, and the wiring layer being provided with a metallic wire.

15. The antenna switch module according to claim 14, wherein the radio-frequency switch device is provided in the silicon-on-insulator substrate in proximity to a surface of the silicon-on-insulator substrate, the surface being on an opposite side of a surface, of the silicon-on-insulator substrate, in contact with the support substrate.

16. The semiconductor device according to claim 14, wherein the radio-frequency switch device is provided in the silicon-on-insulator substrate in proximity to a surface, of the silicon-on-insulator substrate, in contact with the support substrate.

17. The semiconductor device according to claim 14, wherein the support substrate is bonded through the adhesive attachment on both sides of the silicon-on-insulator substrate.

18. The semiconductor device according to claim 16, wherein rewiring is made for the silicon-on-insulator substrate from a surface, of the silicon-on-insulator substrate, close to the radio-frequency switch device.

19. The semiconductor device according to claim 12, wherein rewiring is made for the silicon-on-insulator substrate from a surface, of the silicon-on-insulator substrate, far from the radio-frequency switch device.

20. The semiconductor device according to claim 12, wherein rewiring is made for the silicon-on-insulator substrate via a through-silicon via.

21. The semiconductor device according to claim 12, wherein the first crystal defect is provided, through an ion implantation of one of inert gas, carbon, and silicon, in a depth range of about 100 nm to several micrometers from a surface on the side bonded with the semiconductor layer.

22. The semiconductor device according to claim 12, wherein the crystal defect of the support substrate is provided through irradiation of an electron beam and has a range of the density of about $1 \times 10^{14}$ pieces/cubic centimeter to about $1 \times 10^{16}$ pieces/cubic centimeter.

23. The semiconductor device according to claim 12, wherein the support substrate comprises a substrate in which the crystal defect is provided on the silicon substrate having an oxygen concentration within a range of about $1 \times 10^{15}$ atoms/cubic centimeter to about $1 \times 10^{17}$ atoms/cubic centimeter, having a specific resistance within a range of about 100 Ωcm to about $1 \times 10^5$ Ωcm, and being manufactured in an floating zone method, or comprises a substrate in which the first crystal defect is provided on a silicon substrate having a specific resistance within a range of about 100 Ωcm to about $1 \times 10^5$ Ωcm and in which silicon is epitaxially grown on a substrate manufactured in a Czochralski method or an magnetic-field-applied Czochralski method.

* * * * *